(12) United States Patent
Ooroku et al.

(10) Patent No.: US 6,413,850 B1
(45) Date of Patent: Jul. 2, 2002

(54) METHOD OF FORMING BUMPS

(75) Inventors: Noriyuki Ooroku, Yokohama; Kosuke Inoue, Fujisawa; Takamichi Suzuki, Yokohama; Asao Nishimura, Kokubunji, all of (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 09/640,646

(22) Filed: Aug. 18, 2000

(30) Foreign Application Priority Data

Nov. 18, 1999 (JP) .......................................... 11-328587

(51) Int. Cl.⁷ .............................................. H01L 21/44
(52) U.S. Cl. ...................... 438/613; 438/616; 438/615; 438/612
(58) Field of Search ................................ 438/613, 612, 438/614–617; 228/904, 246

(56) References Cited

U.S. PATENT DOCUMENTS

| | | | |
|---|---|---|---|
| 5,976,965 A | * 11/1999 | Tkahashi et al. | 438/616 |
| 6,024,258 A | * 2/2000 | Ochiai et al. | 438/613 |
| 6,030,889 A | * 2/2000 | Aulicino et al. | 438/613 |
| 6,071,801 A | * 6/2000 | Wachtler et al. | 438/612 |
| 6,117,759 A | * 9/2000 | Greer et al. | 438/616 |
| 6,245,630 B1 | * 6/2001 | Ishikawa | 438/393 |

FOREIGN PATENT DOCUMENTS

| | | | | |
|---|---|---|---|---|
| JP | 411054513 | * | 2/1999 | ......... H01L/21/321 |
| JP | 411163016 | * | 6/1999 | ........... H01L/21/60 |
| JP | 02000114312 | * | 4/2000 | ........... H01L/21/60 |

* cited by examiner

*Primary Examiner*—Charles Bowers
*Assistant Examiner*—Thanh Nguyen
(74) *Attorney, Agent, or Firm*—Antonelli, Terry, Stout & Kraus, LLP

(57) ABSTRACT

The present invention provides a method of forming bumps capable of forming many bumps having an adequate volume and having a narrow range of variations in height and few limitations in selecting materials on an object such as a semiconductor device or the like at high production rates with high reliability and with ease, and a system therefor. The present invention uses a suction head using a porous plate and a stencil having many apertures. Solder balls are previously aligned and charged into the stencil. The solder balls and the stencil are sucked and retained by the suction head and then are positioned with respect to the surfaces of the pads of a semiconductor device and only the solder balls are dropped on the pads. The solder balls are fixed to the pads with an adhesive previously applied thereto and then are reflowed to form bumps.

12 Claims, 16 Drawing Sheets

METHOD OF FORMING BUMPS

BACKGROUND OF THE INVENTION

1. Field of the Invention

The present invention relates to a method of forming bumps which are electrical, mechanical, and thermal connection points to an object such as a semiconductor device or the like, and a system therefor.

2. Description of the Related Art

There are already many methods of forming bumps to a semiconductor device. They include, for example, a plating method in which metal is precipitated on the pads of a semiconductor device by a plating technology to form bumps (related art 1), a printing method in which solder paste is printed on the pads of a semiconductor device and is heated to melt solder particles in the solder paste and in which the solder particles is then solidified on the pads to form bumps (related art 2), and a stud bump method in which one end of a gold wire is bonded to a pad and in which the gold wire is then cut to form a bump (related art 3).

Further, the following methods have been known as related arts of forming bumps by the use of solder balls: first, solder balls are vacuum-sucked by a suction jig, then mounted on the surfaces of the pads of a semiconductor device, then melted by heating, and then solidified, which is disclosed in the specification and the drawings of U.S. Pat. No. 5,284,287 (related art 4); and, secondly, solder balls are vacuum-sucked by the use of a net plate, then mounted on the pads of a semiconductor device, then melted by heating, and then solidified, which is disclosed in Japanese Patent Publication No. 2,897,356 (related art 5).

However, the above-mentioned related arts have the following problems. In general, as the volume of a bump becomes larger, a semiconductor can have a longer connection life when it is connected to an electronic circuit substrate.

However, it is difficult in principle to form a bump having a sufficient volume by the plating method or the printing method (the related art 1 or 2). In addition, the plating method or the printing method presents a problem that when a semiconductor device is connected to an electronic circuit substrate, it is difficult to realize normal connections at all the bumps because the bumps have variations in height.

On the other hand, the stud bump method (the related art 3) presents a problem that it can be applied only to forming bumps made of a specific material such as gold because a wire is made of limited material. Also, the method present a problem that it takes much time to form the bumps in the case where the method is applied to manufacturing a semiconductor device having several tens of thousands of pads because the bumps are formed one by one.

Also, although the solder ball method (the related art 4 or 5) can form the bumps having a narrow range of variations in height and an adequate volume, it uses a jig for vacuum-sucking the solder balls, in which the jig has a complex structure and requires a technology of boring very small pores when the jig is manufactured. Since the jig becomes more expensive in proportion to the number of small pores, in the case where a semiconductor needs many bumps, the jig presents a problem of increasing cost in forming the bumps. Also, the method of using a net plate has an advantage that a jig becomes simple because only a hole having a large diameter in comparison with a solder ball is required to be made and because a net plate is used to prevent the solder balls from being sucked, but the method has a problem that, in the case where a solder ball is mounted above a net-wire of the net plate, the solder ball is sucked at a position shifted from the position where the solder ball is to be sucked.

SUMMARY OF THE INVENTION

In order to solve the problems of the above related arts, it is an object of the present invention to provide a method of forming many bumps having an adequate volume, a narrow range of variations in height, and few limitations in selecting material on an object such as a semiconductor device or the like at high production rates, with high reliability and with ease, and a system therefor.

Also, it is another object of the present invention to provide a method of forming bumps which can simplify a system constitution of forming many bumps on an object such as a semiconductor device or the like by one operation and can form bumps in large quantity, and a system therefor.

In order to accomplish the above objects, according to a first aspect of the present invention, there is provided a method of forming bumps, the method comprising the steps of: an alignment step of placing, on an alignment stage, a plate-like alignment jig having a group of apertures aligned in correspondence with positions where bumps are to be formed, and of sequentially charging many conductive particles supplied such as solder balls into the group of apertures of the plate-like alignment jig to align a group of conductive particles with respect to the plate-like alignment jig; a suction step of sucking and retaining the group of conductive particles aligned at the alignment step and the plate-like alignment jig for aligning the group of conductive particles by a suction unit to separate them from the alignment stage; a positioning step of moving the group of conductive particles and the plate-like alignment jig, both of which are sucked and retained at the suction step, above an object having a group of pads on which bumps are to be formed, and of positioning the plate-like alignment jig relatively to the object; a transfer step of relieving the group of conductive particles of suction and retention by the suction unit, in a state where the plate-like alignment jig positioned relatively to the object at the positioning step is placed close to the object, to transfer the group of conductive particles to the group of pads on the object; and a bonding step of bonding the group of conductive particles transferred at the transfer step to the group of pads on the object to form bumps.

Also, according to a second aspect of the present invention, there is provided a method of forming bumps as described above, in which the above-mentioned alignment step includes the steps of: placing, on an alignment stage, a plate-like alignment jig having a group of apertures aligned in correspondence with positions where bumps are formed; and moving a squeegee storing many conductive particles such as solder balls along the plate-like alignment jig from one end to the other end to sequentially charge the conductive particles into the group of apertures of the plate-like alignment jig to align a group of conductive particles with respect to the late-like alignment jig.

Also, according to a third aspect of the present invention, there is provided a method of forming bumps as described in the first aspect, in which the above-mentioned alignment step includes the steps of: placing, on an alignment stage, a plate-like alignment jig having a group of apertures aligned in correspondence with positions where bumps are to be formed; and moving a squeegee storing many conductive particles such as solder balls and having a sweeping member along the plate-like alignment jig from one end to the other end to sequentially charge the conductive particles into the group of apertures of the plate-like alignment jig, while sweeping away the extra conductive particles by the sweeping member, to align a group of conductive particles with respect to the plate-like alignment jig.

Also, according to a fourth aspect of the present invention, there is provided a method of forming bumps as described in the first aspect, in which the above-mentioned alignment step includes the steps of: placing, on an inclined alignment stage, a plate-like alignment jig having a group of apertures aligned in correspondence with positions where bumps are to be formed; and moving a squeegee storing many conductive particles such as solder balls and having a sweeping member along the inclined plate-like alignment jig from a higher position to a lower position to sequentially charge the conductive particles into the group of apertures of the plate-like alignment jig to align a group of conductive particles with respect to the plate-like alignment jig;

Also, according to a fifth aspect of the present invention, there is provided a method of forming bumps as described in the first aspect, in which the above-mentioned alignment step of: placing, on an inclined alignment stage, a plate-like alignment jig having a group of apertures aligned in correspondence with positions where bumps are to be formed; and moving a squeegee storing many conductive particles such as solder balls and having a sweeping member along the inclined plate-like alignment jig from a higher position to a lower position to sequentially charge the conductive particles into the group of apertures of the plate-like alignment jig, while sweeping away the extra conductive particles by the sweeping member, to align a group of conductive particles with respect to the plate-like alignment jig.

Also, according to a sixth aspect of the present invention, there is provided a method of forming bumps as described in the first aspect, in which the above-mentioned alignment step of: placing, on an inclined alignment stage, a plate-like alignment jig having a group of apertures aligned in correspondence with positions where bumps are to be formed; and moving a squeegee storing many conductive particles such as solder balls and having a sweeping member along the inclined plate-like alignment jig from a higher position to a lower position to sequentially charge the conductive particles into the group of apertures of the plate-like alignment jig based on the rolling motion of the conductive particles stored in the squeegee, while sweeping away the extra conductive particles by the sweeping member, to align a group of conductive particles with respect to the plate-like alignment jig.

Also, according to a seventh aspect of the present invention, there is provided a method of forming bumps as described in any one of the first to sixth aspects, further including an adhesive supply step of supplying an adhesive at least to the group of pads on the object such as a semiconductor device before the positioning step.

Also, according to an eighth aspect of the present invention, there is provided a method of forming bumps as described in any one of the first to sixth aspects, further including an inspection step of inspecting, after the alignment step, the state of the group of conductive particles aligned with the group of apertures of the plate-like alignment jig at the alignment step.

Also, according to a ninth aspect of the present invention, there is provided a method of forming bumps as described in any one of the first to sixth aspects, further including an inspection step of inspecting, after the alignment step, the state of the group of conductive particles aligned with the group of apertures of the plate-like alignment jig at the alignment step, and another alignment step executed in the case where the results of inspection at the inspection step reveal that the number of the apertures of the alignment jig which are not filled with the conductive particles exceeds the maximum permissible number.

Also, according to a tenth aspect of the present invention, there is provided a method of forming bumps as described in any one of the first to sixth aspects, further including an inspection step of inspecting, after the transfer step, the state of the group of conductive particles transferred to the group of pads on the object at the transfer step.

Also, according to an eleventh aspect of the present invention, there is provided a method of forming bumps as described in any one of the first to sixth aspects, further including an inspection step of inspecting, after the transfer step, the state of the group of conductive particles transferred to the group of pads on the object at the transfer step, and a repair step of selectively mounting the conductive particles on the pads on which the conductive particles are not mounted in the case where the results of inspection at the inspection step reveal that the number of the pads which are not mounted with the conductive particles exceeds the maximum permissible number, and of selectively removing the extra conductive particles in the case where the results of inspection at the inspection step reveal that the number of the extra conductive particles exceeds the maximum permissible number.

Also, according to a twelfth aspect of the present invention, there is provided a method of forming bumps as described in any one of the first to sixth aspects, further including a cutting step of cutting the object having bumps formed on the pads at the bonding step by a desired unit, after the bump forming step.

Also, according to a thirteenth aspect of the present invention, there is provided a system of forming bumps, the system comprising: an alignment unit for placing, on an alignment stage, a plate-like alignment jig having a group of apertures aligned in correspondence with positions where bumps are to be formed, and for sequentially charging many conductive particles supplied into the group of apertures of the plate-like alignment jig to align a group of conductive particles with respect to the plate-like alignment jig; a suction unit for sucking and retaining the group of conductive particles aligned by the alignment unit and the plate-like alignment jig for aligning the group of conductive particles to separate them from the alignment stage; and a transfer control unit for moving the group of conductive particles and the plate-like alignment jig, both of which are sucked and retained by the suction unit, above an object having a group of pads on which bumps are to be formed, and for positioning the plate-like jig relatively to the object, and for relieving the group of conductive particles of suction and retention by the suction unit, in a state where the plate-like alignment jig positioned relatively to the object is placed close to the object, to transfer the group of conductive particles to the group of pads on the object, wherein the group of conductive particles transferred by the transfer unit are bonded to the group of pads on the object to form bumps.

Also, according to a fourteenth aspect of the present invention, there is provided a system of forming bumps as described in the thirteenth aspect, in which the alignment unit places, on an alignment stage, a plate-like alignment jig having a group of apertures aligned in correspondence with positions where bumps are to be formed and moves a squeegee storing many conductive particles along the plate-like alignment jig from one end to the other end to sequentially charge the conductive particles into the group of apertures of the plate-like alignment jig to align a group of conductive particles with respect to the plate-like alignment jig.

Also, according to a fifteenth aspect of the present invention, there is provided a system of forming bumps as described in the thirteenth aspect, in which the alignment unit places, on an alignment stage, a plate-like alignment jig having a group of apertures formed in correspondence with positions where bumps are to be formed and moves a squeegee storing many conductive particles and having a sweeping member along the plate-like alignment jig from one end to the other end to sequentially charge the conductive particles into the group of apertures of the plate-like alignment jig, while sweeping away the extra conductive particles by the sweeping member, to align a group of conductive particles with respect to the plate-like alignment jig.

Also, according to a sixteenth aspect of the present invention, there is provided a system of forming bumps as described in the thirteenth aspect, in which the alignment unit places, on an inclined alignment stage, a plate-like alignment jig having a group of apertures aligned in correspondence with positions where bumps are to be formed and moves a squeegee storing many conductive particles and having a sweeping member along the inclined plate-like alignment jig from a higher position to a lower position to sequentially charge the stored conductive particles into the group of apertures of the plate-like alignment jig to align a group of conductive articles with respect to the plate-like alignment jig.

Also, according to a seventeenth aspect of the present invention, there is provided a system of forming bumps as described in the thirteenth aspect, in which the alignment unit places, on an inclined alignment stage, a plate-like alignment jig having a group of apertures aligned in correspondence with positions where bumps are to be formed and moves a squeegee storing many conductive particles and having a sweeping member along the inclined plate-like alignment jig from a higher position to a lower position to sequentially charge the stored conductive particles into the group of apertures of the plate-like alignment jig, while sweeping away the extra conductive particles by the sweeping member, to align a group of conductive particles with respect to the plate-like alignment jig.

Also, according to an eighteenth aspect of the present invention, there is provided a system of forming bumps as described in the thirteenth aspect, in which the alignment unit places, on an inclined alignment stage, a plate-like alignment jig having a group of apertures aligned in correspondence with positions where bumps are formed and moves a squeegee storing many conductive particles and having a sweeping member along the inclined plate-like alignment jig from a higher position to a lower position to sequentially charge the conductive particles into the group of apertures of the plate-like alignment jig based on the rolling motion of the conductive particles stored in the squeegee, while sweeping away the extra conductive particles by the sweeping member, to align a group of conductive particles with respect to the plate-like alignment jig.

Also, according to a nineteenth aspect of the present invention, there is provided a system of forming bumps as described in any one of the thirteenth aspect to the eighteenth aspect, further including a visual inspection unit for inspecting the state of the group of conductive particles aligned with the group of apertures of the plate-like alignment jig by the alignment unit.

Also, according to a twentieth aspect of the present invention, there is provided a system of forming bumps as described in any one of the thirteenth aspect to the eighteenth aspect, further including a visual inspection unit for inspecting the state of the group of conductive particles transferred to the group of pads on the object by the transfer control unit.

Also, according to a twenty-first aspect of the present invention, there is provided a system of forming bumps as described in any one of the thirteenth aspect to the eighteenth aspect, further including a visual inspection unit for inspecting the state of the group of conductive particles transferred to the group of pads on the object by the transfer control unit, and a repair unit for selectively mounting the conductive particles on the pads on which the conductive particles are not mounted in the case where the results of inspection by the visual inspection unit reveal that the number of the pads which are not mounted with the conductive particles exceeds the maximum permissible number, and for selectively removing the extra conductive particles in the case where the results of inspection by the visual inspection unit reveal that the number of the extra conductive particles exceeds the maximum permissible number.

Also, according to a twenty-second aspect of the present invention, there is provided a system of forming bumps as described in any one of the thirteenth aspect to the eighteenth aspect, in which the suction unit is. constituted by a vacuum suction unit.

Also, according to a twenty-third aspect of the present invention, there is provided a system of forming bumps as described in any one of the thirteenth aspect to the eighteenth aspect, in which the suction unit is constituted by a vacuum suction unit having a porous substrate at the portion where the group of conductive particles are sucked.

Also, according to a twenty-fourth aspect of the present invention, there is provided a system of forming bumps as described in any one of the fifteenth, seventeenth, and eighteenth aspects, in which the alignment unit has a sweeping member constituted by a plurality of flexible wires.

As described above, according to the above-mentioned constitution, it is possible to form bumps using conductive particles such as solder balls having an adequate volume, a narrow range of variations in height, and few limitations in selecting material, by one operation at high production rates with high reliability and with ease.

Also, according to the above-mentioned constitution, it is possible to simplify a system constitution for forming many bumps on an object such as a semiconductor device or the like by one operation and to form the bumps in large quantity.

Also, according to the above-mentioned constitution, it is possible to inspect the number of conductive particles such as solder balls and to replenish the conductive particles or to repair the arrangement thereof, if necessary, to thereby further improve reliability.

BRIEF DESCRIPTION OF THE DRAWINGS

Preferred embodiments of the present invention will be described in detail based on the following figures, in which.

DETAILED DESCRIPTION OF THE PREFERRED EMBODIMENTS

A method of forming bumps and a system therefor in accordance with the present invention will be described in conjunction with the accompanying drawings.

Figure 1:
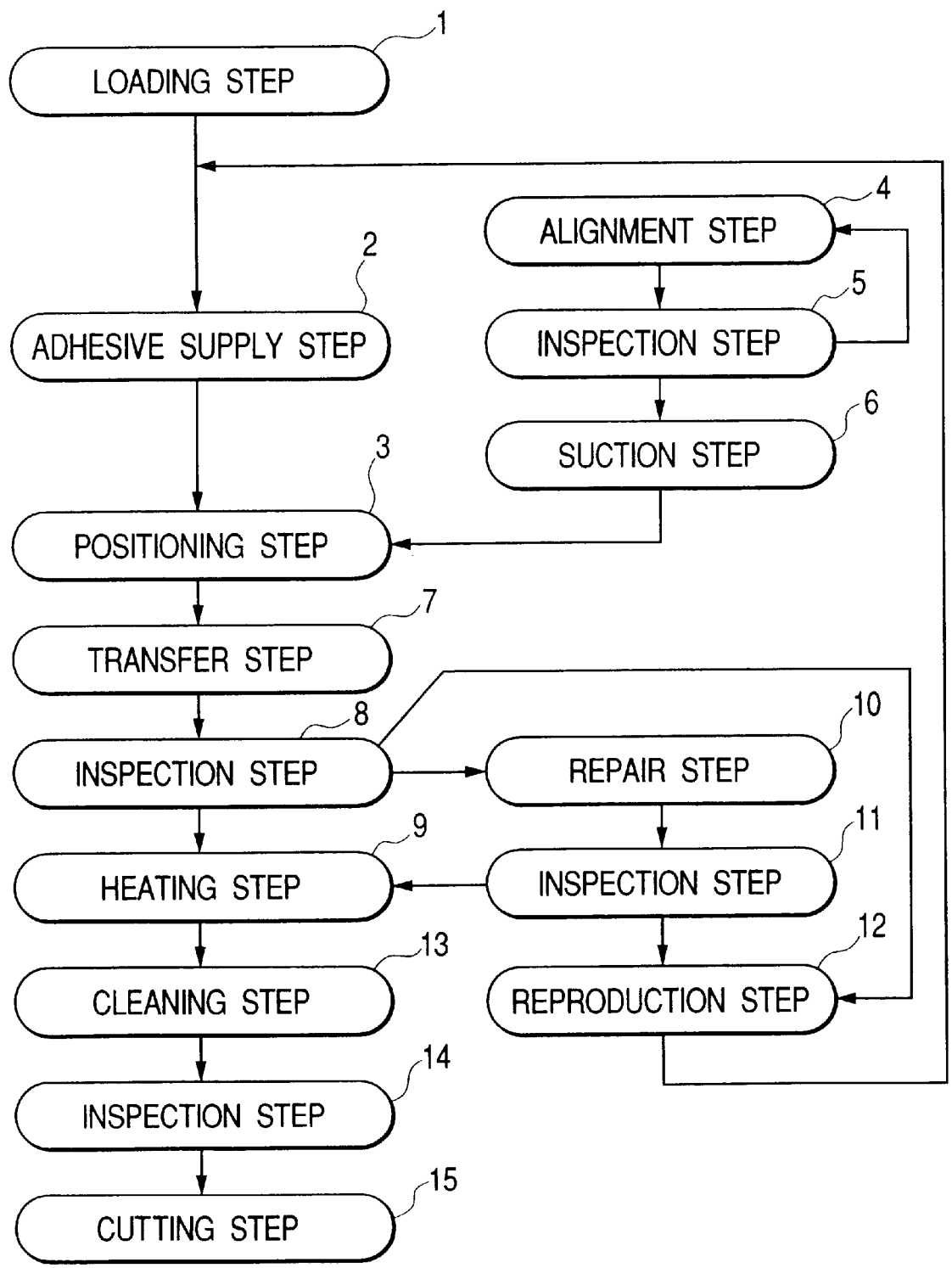
FIG. 1 is an illustration showing a basic flow of forming bumps in accordance with the present invention.
Figure 2:
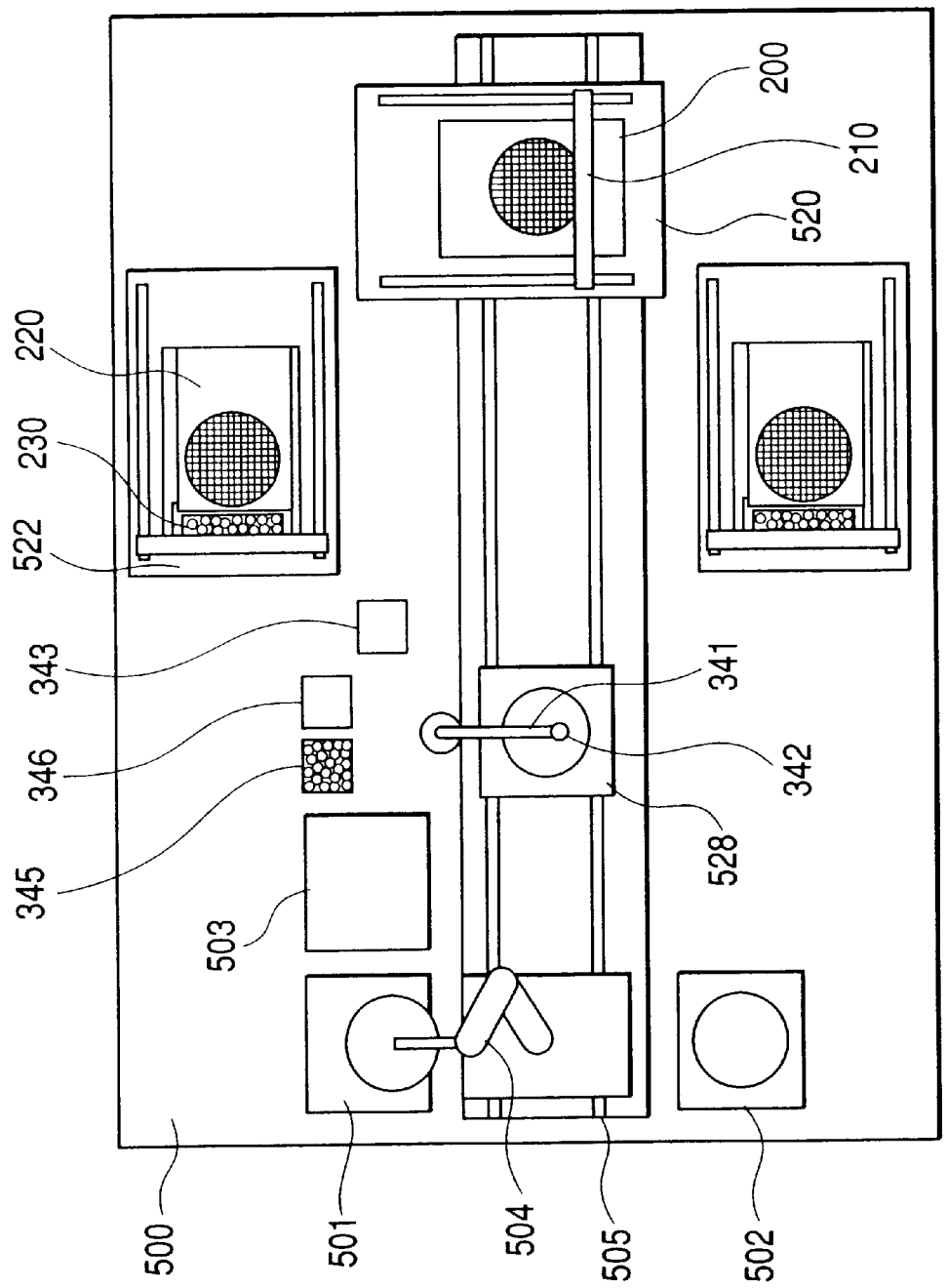
FIG. 2 is a plan view showing the basic constitution of a system of forming bumps in accordance with the present invention.

FIG. 1 is a basic flow chart of forming bumps in accordance with the present invention. FIG. 2 is a basic constitution of a system of forming bumps in accordance with the present invention.

That is, as shown in FIG. 1, the basic flow of forming bumps in accordance with the present invention is constituted by: a main flow including a loading step 1, an adhesive supply step 2, a positioning step 3, a transfer step 7, an inspection step 8, a heating step 9, a cleaning step 13, an inspection step 14, and a cutting step 15, if necessary; a first sub-flow including an alignment step 4, an inspection step 5 and a suction step 6; and a second sub-flow including a repair step 10, an inspection step 11, and a reproduction step 12, the first and second sub-flows characterizing the present invention.

The loading step 1 is a step of loading an object 100 into a system of forming bumps. That is, as shown in FIG. 2, the loading step 1 includes the steps of: inserting a cassette holding an object 100 such as a semiconductor device or the like on which bumps are to be formed into a loader 501; taking out the object 100 from the cassette inserted into the loader 501 and mounting on a positioning mechanism 503 by a robot mechanism 504 such as a load arm or the like; positioning the object 100 with respect to a reference mark such as a notch or the like formed on the object 100 by the positioning mechanism 503; mounting the object 100 positioned on an inching stage 280 on a transfer unit 528 by the robot mechanism 504, for example; and transferring the transfer unit 528 to an adhesive supply station along a transfer rail 505. In this connection, in the loading step 1, the object 100 such as a semiconductor device, packed electric device or circuit board or the like is loaded in a state of a wafer shown in FIG. 3 or in a state of separated chips which are separated from a wafer and are secured to a substrate or the like.

Figure 3:
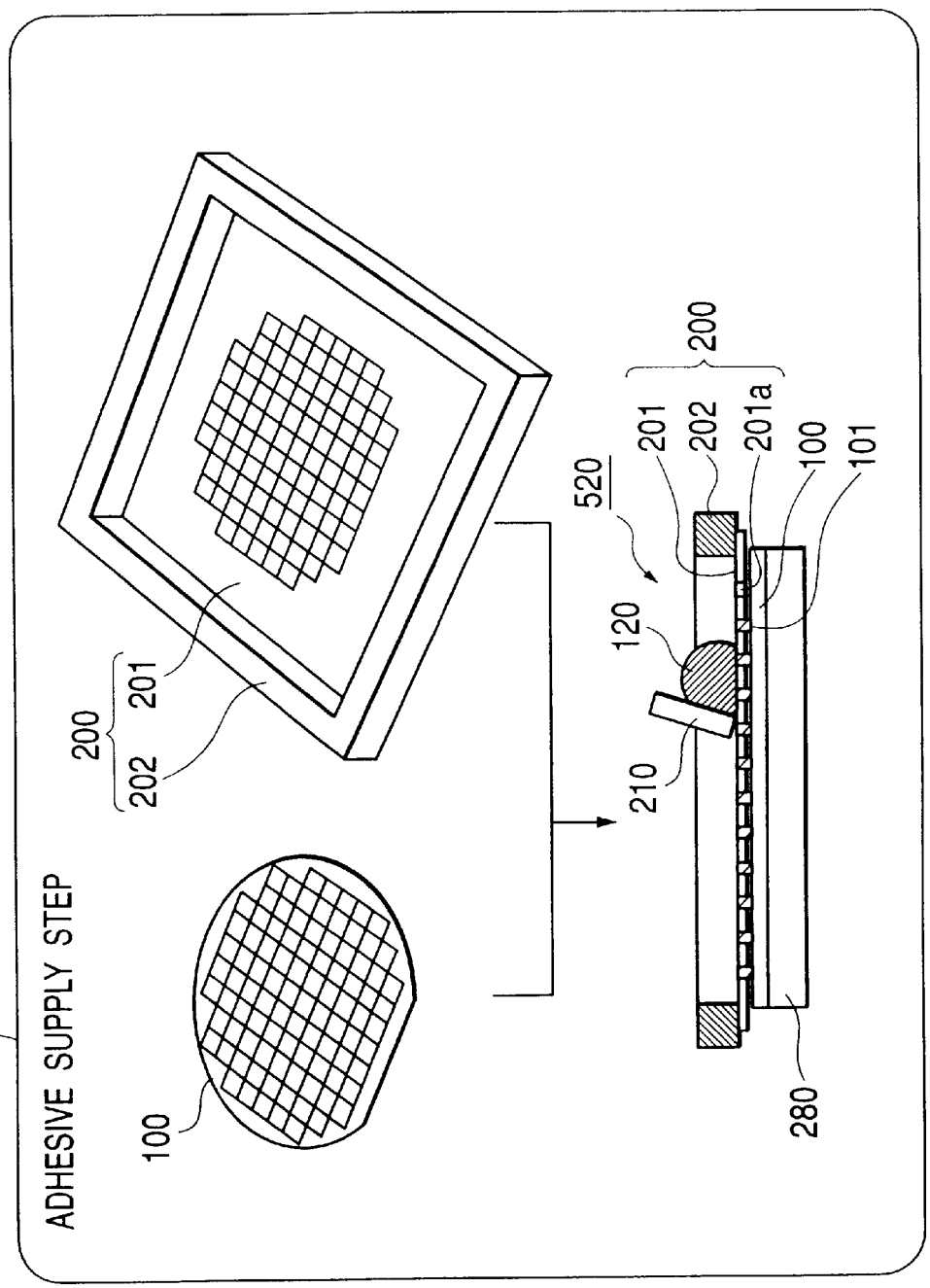
FIG. 3 is an illustration describing an adhesive supply step of a flow of forming bumps in accordance with the present invention.

At the adhesive supply step 2, an adhesive 120 of FIG. 3 such as flux, solder paste, conductive adhesive or the like is supplied, by an adhesive supply unit 520 shown in FIG. 2 mounted on the adhesive supply station, to bump forming points (pads 101) on the object 100 which is to be transferred to the adhesive supply station by the transfer unit 528. That is, at the adhesive supply step 2, as shown in FIG. 3, the object 100 such as a wafer or the like is fixed on the inching stage 280 mounted on the transfer unit 528 by vacuum suction. Then, at the adhesive supply step 2, a mask constituted by a frame 202 and a stencil 201 having apertures 201a and put on the frame 202 is relatively positioned with respect to the object 100 in such a way that the apertures 201a are positioned with respect to the pad 101 and then the adhesive 120 such as flux or the like is supplied to the pads 101 through the apertures 201a by printing. In the case where the adhesive 120 such as flux is supplied by printing, the adhesive 120 such as flux is printed into the stencil 201 by a squeegee 210 made of rubber and is printed and supplied to the pads 101 on the object 100 through the apertures 201a. In this connection, depending on the kinds of the adhesive used, instead of the printing method, a stamp transfer method, a total surface applying method, or a dispense method can be also used. For example, in the case where flux having middle fluidity is used as the adhesive, the stamp transfer method can be used; in the case where flux having extremely high fluidity is used, the total surface application method such as a spin coat method can be used; in the case where solder paste made of flux and solder particles mixed therein is used, a screen printing method can be used; and in the case where a conductive adhesive is used, the dispense method can be used.

Figure 4:
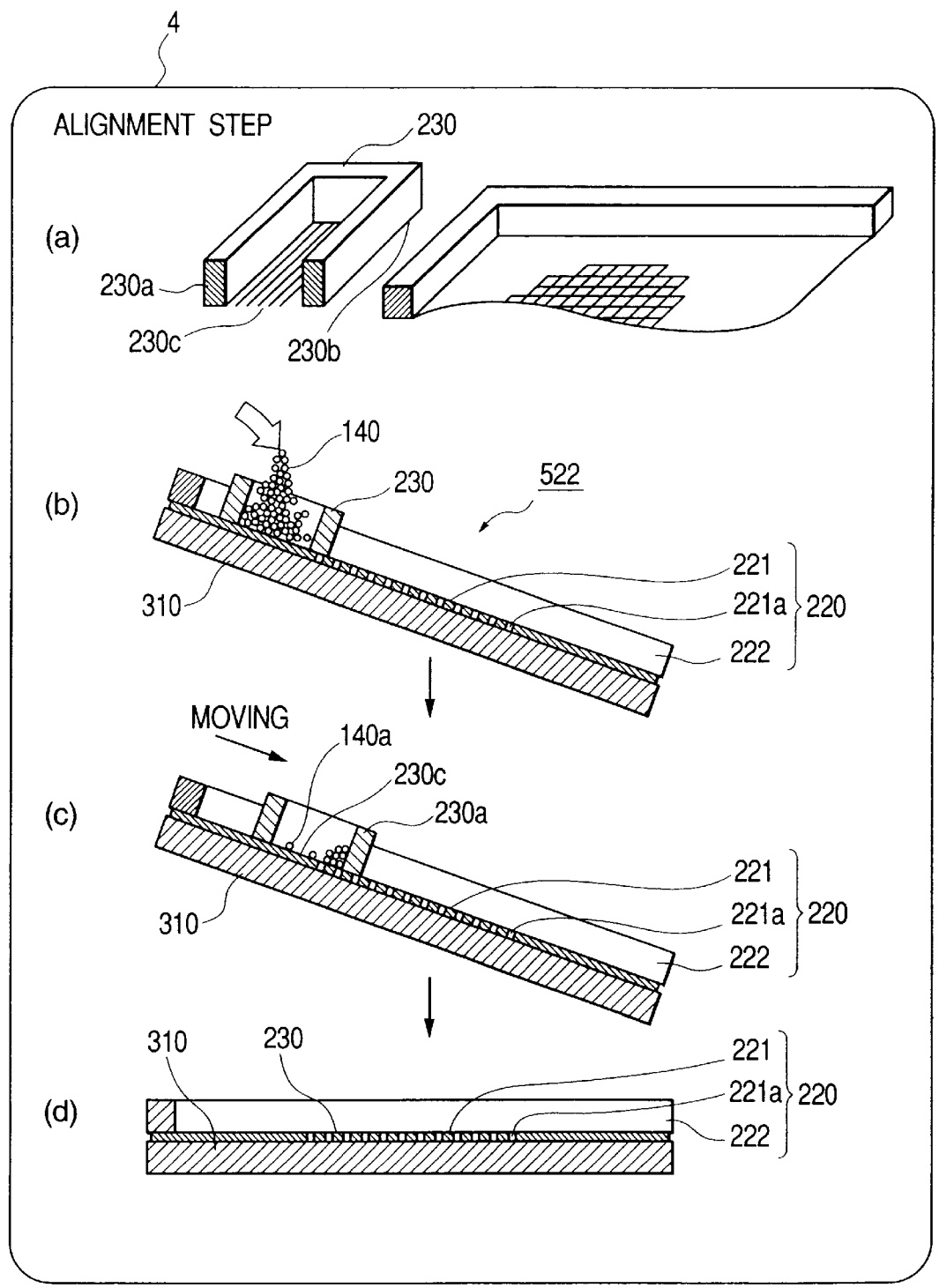
FIG. 4 is an illustration describing an alignment step of a flow of forming bumps in accordance with the present invention.

Next, the preferred embodiments of the first sub-flow characterizing the present invention will be described. The alignment step 4, the inspection step 5 and the suction step 6 constituting the first sub-flow are performed concurrently with the adhesive supply step 522 in an alignment unit 522, an visual inspection unit 320, and a suction unit 522 which are mounted on each of a plurality of alignment suction stations. As shown in FIG. 4, the alignment unit 522 is constituted by an inclined alignment stage 310 inclined between 15 to 30 degrees whose degree is selected between 15 to 30 depending on the diameter of solder boll 10, a ball mask (ball alignment jig) 220 arranged on the inclined alignment stage 310 and constituted by a U shaped frame 222 and a stencil 221 having apertures 221a formed at portions corresponding to the pads 101 of the object 100, and a ball squeegee 230 (a halved ball squeegee 230 is shown in FIG. 4(a)) constituted by a rectangular frame 230a and a plurality of flexible wires 230c functioning as sweeping members and strung between both ends of the frame 230c in the direction of the length. The stencil 221 is a thin plate having apertures 221a in which solder balls 140 are aligned in correspondence with the pads 101 aligned on the object 100.

Figure 5:
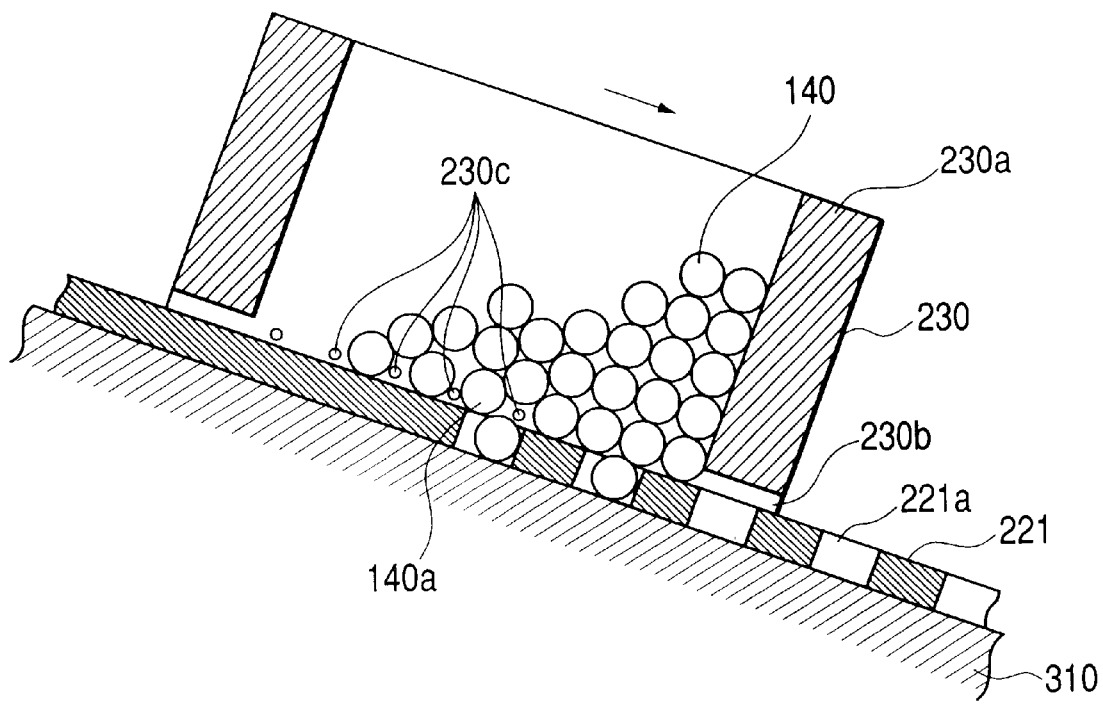
FIG. 5 is a cross sectional view showing a state in which solder balls are charged into the apertures of a ball mask by the use of a ball squeegee provided with a plurality of wires as a sweeping member at the alignment step shown in FIG. 4.

In particular, as shown in FIG. 4(b), (c) and in FIG. 5, the inclined ball squeegee 230 is moved from a higher position to a lower position along the slope on the ball mask 220 and hence conductive particle-shaped solder balls 140 supplied into the ball squeegee 230 are moved (rolled) down along the slope by their own weight and the solder balls 140 nearest to the frame at the lower side are sequentially fitted (charged) into the apertures 221a formed in the stencil 221. For this reason, there is no wire 230c near the frame 230a at the lower side. Further, a gap between the wire at the uppermost side and the frame at the upper side is made so small that the solder ball 140 can not enter the gap.

Further, the thickness of the stencil 221 is made a little smaller than the diameter of the solder ball 140 so that the wires 230c can easily scrape the extra solder balls 140. A sled-shaped part 230b projecting about half of the diameter of the solder ball 140 is formed at the bottom of each of both ends of the frame 230a in the direction of the length of the ball squeegee 230. Therefore, the sled-shaped part 230b contacts the surface of the stencil 221 to form a gap, which is half the diameter of the solder ball 140, between the bottom of the frame 230a and the surface of the stencil 221 and, therefore, the bottom of the frame 230a does not contact the solder balls 140 charged into the apertures 221a of the stencil 221.

As described above, in the alignment step 4, the ball squeegee 230 supplied with many conductive solder balls 140 shaped like particles is moved from the higher portion to the lower portion along the slope on the stencil 221 of the ball mask 220 inclined about 15–30 degrees with the inclined alignment stage 310. Here, solder balls 140 are charged into the apertures 221a of the stencil 221 while rolling down along the slope and, as shown in FIG. 4(c) and FIG. 5, the extra solder balls sticking to stencil 221 are scraped by the wires 230c. The wire 230c is made of a twisted tungsten wire, for example, and has flexibility (or elasticity, that is, of expanding when force is applied to thereto and contracting when the force is removed) and applies force to the extra solder ball 140a at the position lower than the center of the extra solder ball 140a to thereby prevent excessive force from being applied to the extra solder ball 140a to push up the extra solder ball 140a, which results in avoiding causing damage such as a hit mark or deformation to the solder ball 140a. Since the extra solder balls 140a are scraped by a plurality of wires 230c, or sweeping members, strung in the direction crossing the direction of the movement of the ball squeegee 230 in this manner, it is easy to set the height of the wire 230c from the surface of the stencil 221 (less than the radius of the solder ball) and it is possible to prevent excessive force from being applied to the extra solder ball 140a easily deformed in the direction of the movement of the ball squeegee 230.

Finally, the ball squeegee 230 is moved off the aperture of the frame 222 of the ball mask 220, whereby the solder balls 140 not used are pushed and discharged outside the inclined alignment stage 310. Then, the inclined alignment stage 310 and the ball mask 220 are returned to a horizontal state as shown in FIG. 4(d).

In this connection, the diameter of the aperture 221a ranges from one time to two times the diameter of the solder ball 140 used in the alignment step 4 (that is, one solder ball is fitted in the aperture 221a but two balls can not be fitted therein). However, if the diameter of the aperture 221a is made larger nearly twice, the positioning accuracy of the solder ball 140 is reduced by the same amount and the volume of the extra solder ball 140a fitted in the aperture 221a is increased, which makes it difficult to scrape the extra solder ball with the wire 230c. For example, in the case where the size of the pad 101 on the object 100 is about 0.2 mm and the diameter of the solder ball 140 is about 0.3 mm, the permissible amount of shift in positioning of the solder ball 140 is about 0.1 mm. Therefore, it is preferable that the diameter of the aperture 221a is about 1.1–1.5 times the diameter of the solder ball 140.

Also, the aperture 221a of the stencil 221 can be fabricated mechanically with a drill or the like, or can be fabricated chemically by an etching or an additive method, and an adequate fabricating method can be adopted according to the number of the apertures 221a to produce the stencil 221 at relatively low cost, which results in providing an inexpensive ball mask 220.

Figure 6:
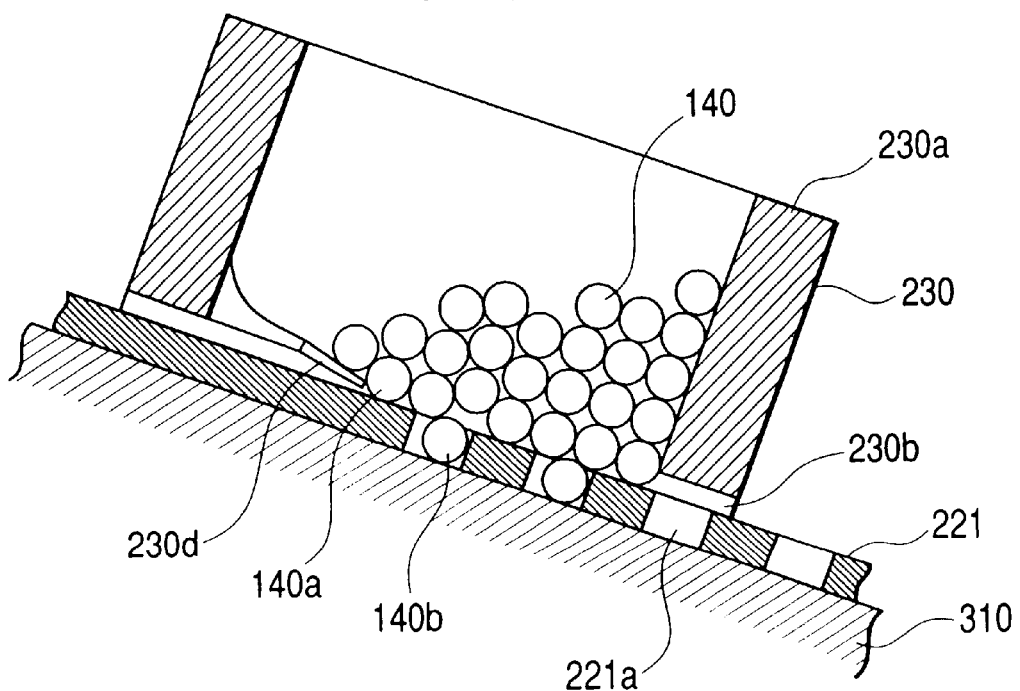
FIG. 6 is a cross sectional view showing a state in which solder balls are charged into the apertures of a ball mask by the use of a ball squeegee provided with a squeegee such as a brush or a spatula as a sweeping member at the alignment step shown in FIG. 4.

Up to this point, while an example has been described in which a plurality of wires 230c strung between the bottom portions of both ends of the frame 230a in the direction of length are used to scrape the extra solder balls, a squeegee 230d shaped like a brush or a spatula having stiffness similar to the wire 230c and a highly accurately aligned tip end shown in FIG. 6 may be also used instead of the plurality of wires 230c.

To prevent the solder ball 140b once fitted in the aperture 221a from being picked out, the tip end of the squeegee 230d shaped like a brush or a spatula is aligned specially accurately. Also, the squeegee 230d shaped like a brush or a spatula is put under the bottom portion of the solder ball at a small angle because it can push up and scrape the extra solder balls.

Basically, the ball squeegee 230 supplied with many particle shaped solder balls 140 are moved from the higher position to the lower position along the slope on the stencil 221 to charge the solder balls 140 into the apertures 221a of the stencil 221 while rolling down the solder balls 140 along the slope to scrape the extra solder balls 140a without causing damage such as striking mark or deformation to them with the sweeping members such as the wires 230c or the squeegee 230d shaped like a brush or a spatula.

In this connection, in the alignment step 4, in the case where many conductive particle-shaped solder balls 140 having a diameter of 0.3 mm are supplied to and stored in the ball squeegee 230, the ball squeegee 230 is moved from the higher position to the lower position on the stencil 221 of the ball mask 220 inclined about 15–30 degrees with the inclined alignment stage 310 to roll down many solder balls 140 along the slope to easily charge them into the apertures 221a made in the ball mask 220, but in the case where the solder balls stored in the ball squeegee 230 are reduced in number, the alignment stage 310 and the ball mask 230 mounted thereon are not necessarily inclined, if some thought is put into designing the sweeping member. Also, in the case where the alignment stage 310 and the ball mask 220 are inclined, if the extra solder balls 140a are not lodged in the solder balls charged in the apertures 221a because the solder balls stored in the ball squeegee 230 are reduced in number, the sweeping member like the wire 230c is not necessarily mounted.

Figure 7:
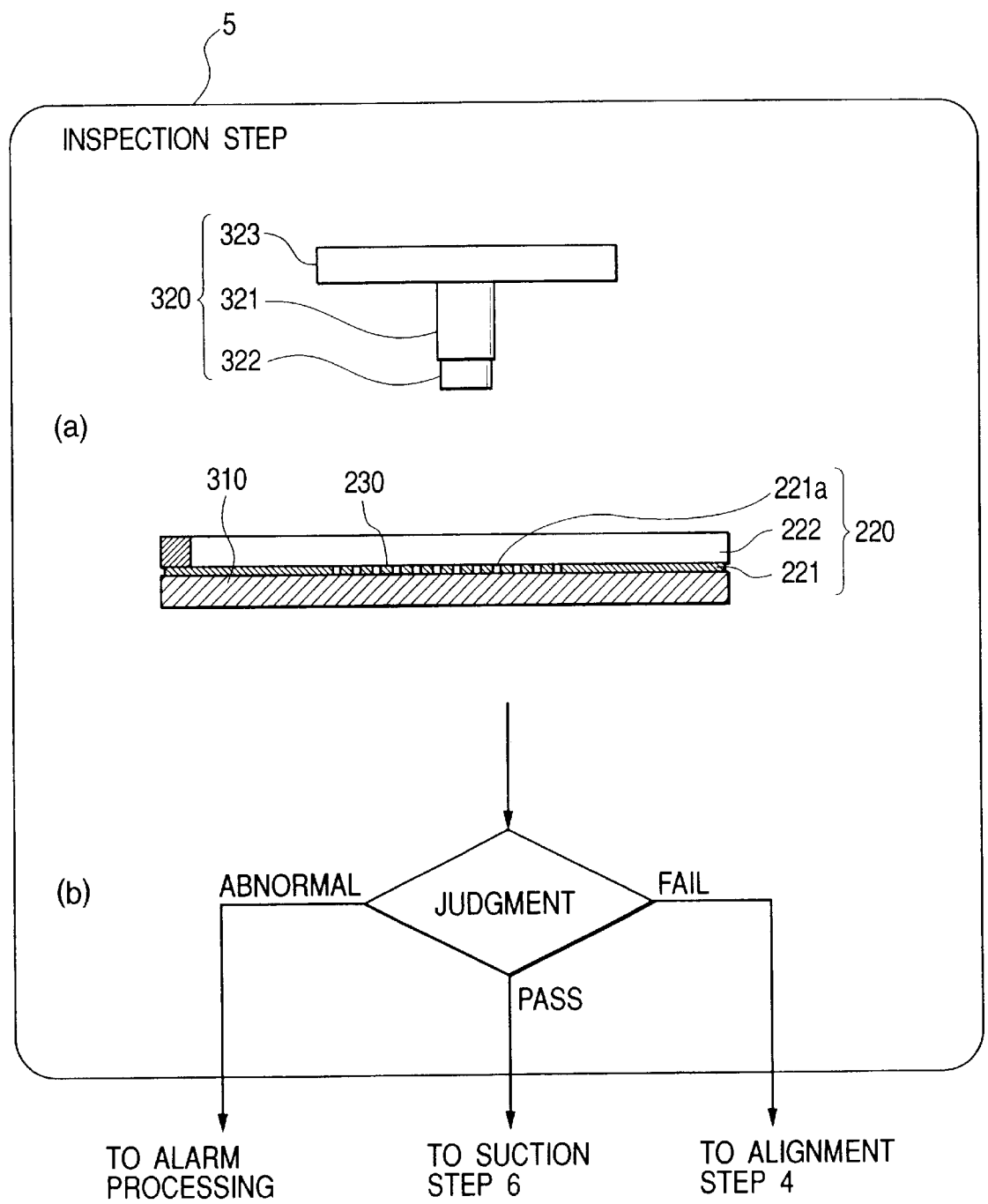
FIG. 7 is an illustration describing an inspection step after the alignment step of a flow of forming bumps in accordance with the present invention.

Next, in the inspection step 5, the visual inspection unit 320 is placed above the alignment unit 522 with the ball squeegee 230 withdrawn, as shown in FIG. 7(*a*), and the presence or absence of the solder ball charged in the alignment step 4 is checked with the visual inspection unit 320.

That is, the visual inspection unit 320 is constituted by, for example; a lighting system (not shown) for lighting the dark field of view; a detection optical system including a lens 322 for focusing an image formed by light scattered from the stencil 221 including solder balls and a CCD camera 321 for picking up the image of solder ball focused by the lens 322; a moving mechanism 323 for moving the lighting optical system and the detection optical system; and an image processing unit (not shown) for processing the image of the solder balls produced by the CCD camera 321 of the above-mentioned inspection optical system to judge the presence or absence of the solder balls charged into all the apertures 221*a* to decide the abnormality, the pass or fail of the solder ball based on the judgment, as shown in FIG. 7(*b*).

In this manner, in the inspection process 5, the solder ball 140 charged into the aperture 221*a* is clearly detected as a bright ring-shaped image by two-dimensionally moving the lighting optical system and the detection optical system with the moving mechanism 323 and the presence or absence of the solder ball is sequentially inspected by an image processing to judge the abnormality, the pass or fail of the solder ball.

As a result, if the state of charging of the solder balls 140 is judged to pass an inspection test, the processing proceeds to the suction step 6, and if it is judged to fail in the inspection test, the processing returns to the alignment step 4 and the solder balls are charged again. In the case where any apertures 221*a* are not filled with the solder balls, the all squeegee 230 is moved again in the state in which the ball squeegee 230 is supplied with the solder balls. Also, in the case where the solder balls are excessively supplied to the apertures 221*a*, the empty ball squeegee 230 is moved again to scrape away the extra solder balls with the wire 230*c* or the squeegee 230*d* shaped like a brush of a spatula.

In the case where the solder balls are extremely poorly charged into the apertures 221*a*, or in the case where the solder balls can not successfully pass the inspection test even if the alignment step 4 is repeated, the solder ball is assumed to be in an abnormal state caused by the soiled ball mask 220, the abnormal size of the solder ball 140, or the like and an alarm processing is performed. In this case, a maintenance work is usually performed to the alignment unit 522.

In this connection, the criteria of judgment performed by the image processing unit of the visual inspection unit 320 (the maximum permissible number of apertures 221*a* which are not filled with solder balls, the maximum permissible number of extra solder balls the maximum permissible number of retrials) are changed according to a required yield, a necessary production cycle time, or the number of the solder balls charged by one operation, that is, the maximum permissible values are set according to the kinds of bumps to be formed.

Figure 8:
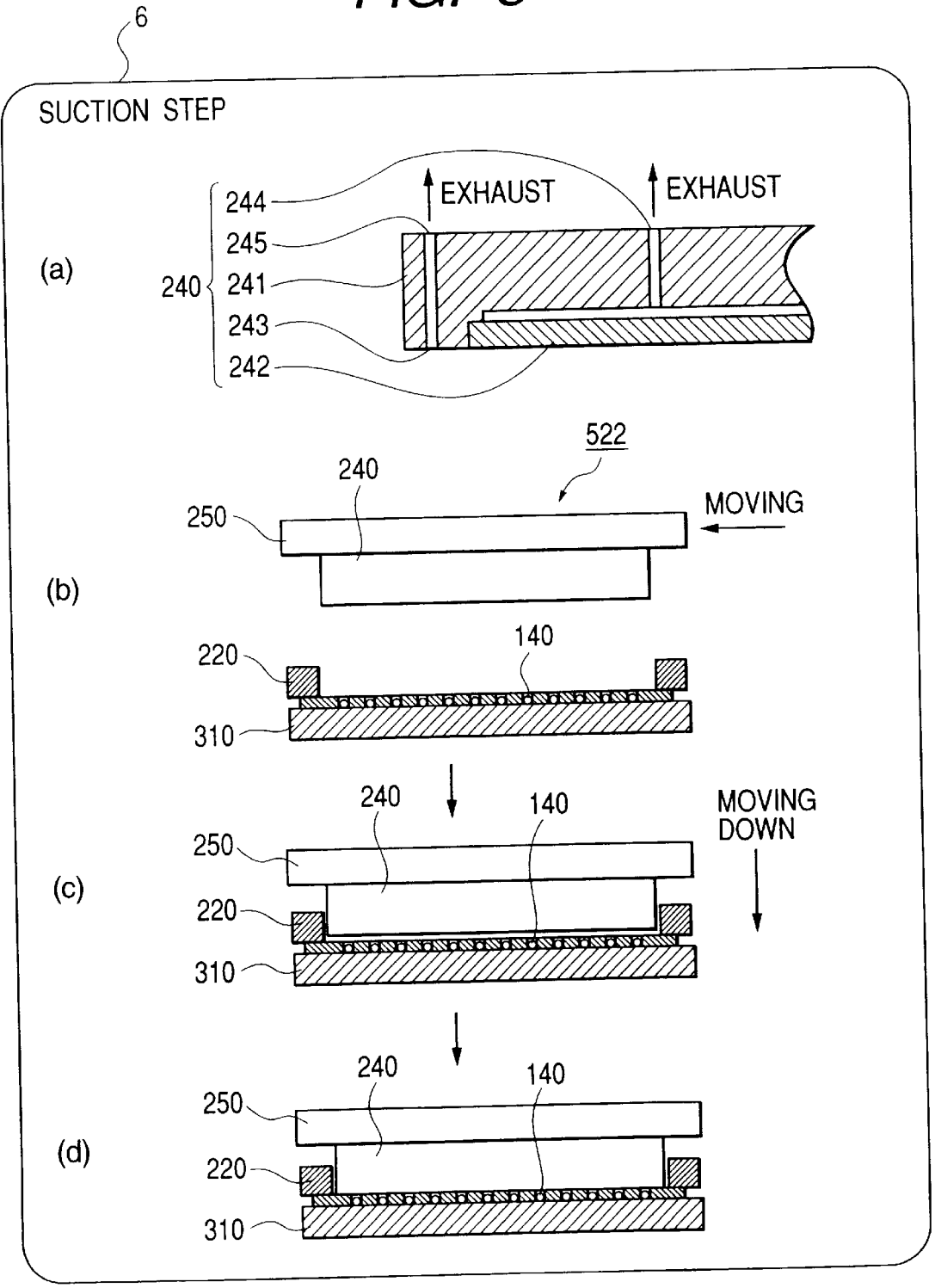
FIG. 8 is an illustration describing a suction step of a flow of forming bumps in accordance with the present invention.

Next, in the suction step 6, as shown in FIGS. 8(*b*), (*c*) (*d*), the visual inspection unit 320 is retracted and the suction unit 522 is introduced and moved down to suck the ball mask 220 and the charged solder balls 140 by a suction head 240.

The suction head 240 is constituted by a base body 241 and a porous plate 242 buried in the base body 241, as shown in a cross-sectional view in FIG. 8(*a*), the base body 241 having a plurality of mask suction holes 243 around the porous plate 242. Further, the porous plate 242 communicates with a porous plate air outlet 244 and the mask suction holes 243 communicate with mask air outlets 245, these porous plate 242 and the mask suction holes 243 being constituted in such a way that they can be independently sucked. The porous plate 242 is formed by finely porous ceramics, for example, so that various kinds of ball masks can suck the charged solder balls 140 by one operation. It is preferable that the sizes of pores of the porous ceramics are less than about one fifth of the diameter of the solder ball 140 so that the porous plate 242 does not dent the surface of solder ball 140 and uniformly sucks the solder balls 140 when the porous plate 242 sucks the solder balls 140. In particular, since the porous plate 242 sucks a group of solder balls 140 charged into the ball mask 220, if the ball mask 220 is not mounted, there is the possibility that the solder balls sucked might be shifted in positions. Therefore, if the ball mask 220 is sucked together with the solder balls by the suction head 240, it can prevent the solder balls from being shifted in position.

The suction head 240 is moved above the inclined alignment stage 310 by a head moving mechanism 250 and then is lowered so that it is fitted into the ball mask 220, as shown in FIG. 8, whereby the porous plate 240 comes to be opposed to a group of all aligned solder balls 140. Here, it is preferable that the gap between the bottom surface of the suction head 240 lower and upper surface of the stencil 221 is limited to a value less than the half of the diameter of the solder ball 140 to prevent the porous plate 242 from pressing on the solder balls 140 and the stencil 221 excessively and the solder balls 140 from jumping out of the apertures 221*a*. Then, air is evacuated from the porous air outlet 244 and the mask air outlet 245, whereby the group of solder balls 140 and the ball mask 220 are sucked by the suction head 240. Here, it is preferable that a vacuum pressure at the back of the porous plate 242 is a suitable negative pressure not to cause damage to the solder balls 140 (in the case where a relatively soft tin-lead eutectic solder ball having a diameter of 0.3 mm is used, the negative pressure ranges from about −1 kPa to −10 kPa). In the case where a Pb-free solder ball such as a Sn—Ag—Bi solder ball is used, naturally, the negative pressure can be increased a little because it is harder than the tin-lead eutectic solder ball.

The first sub-flow including the alignment step 4, the inspection step 5, and the suction step 6 is performed in this manner to produce a state in which many solder balls 140 aligned in correspondence with many pads 101 formed on the object 100 and the ball mask 220 are sucked together by the suction head 240.

Figure 9:
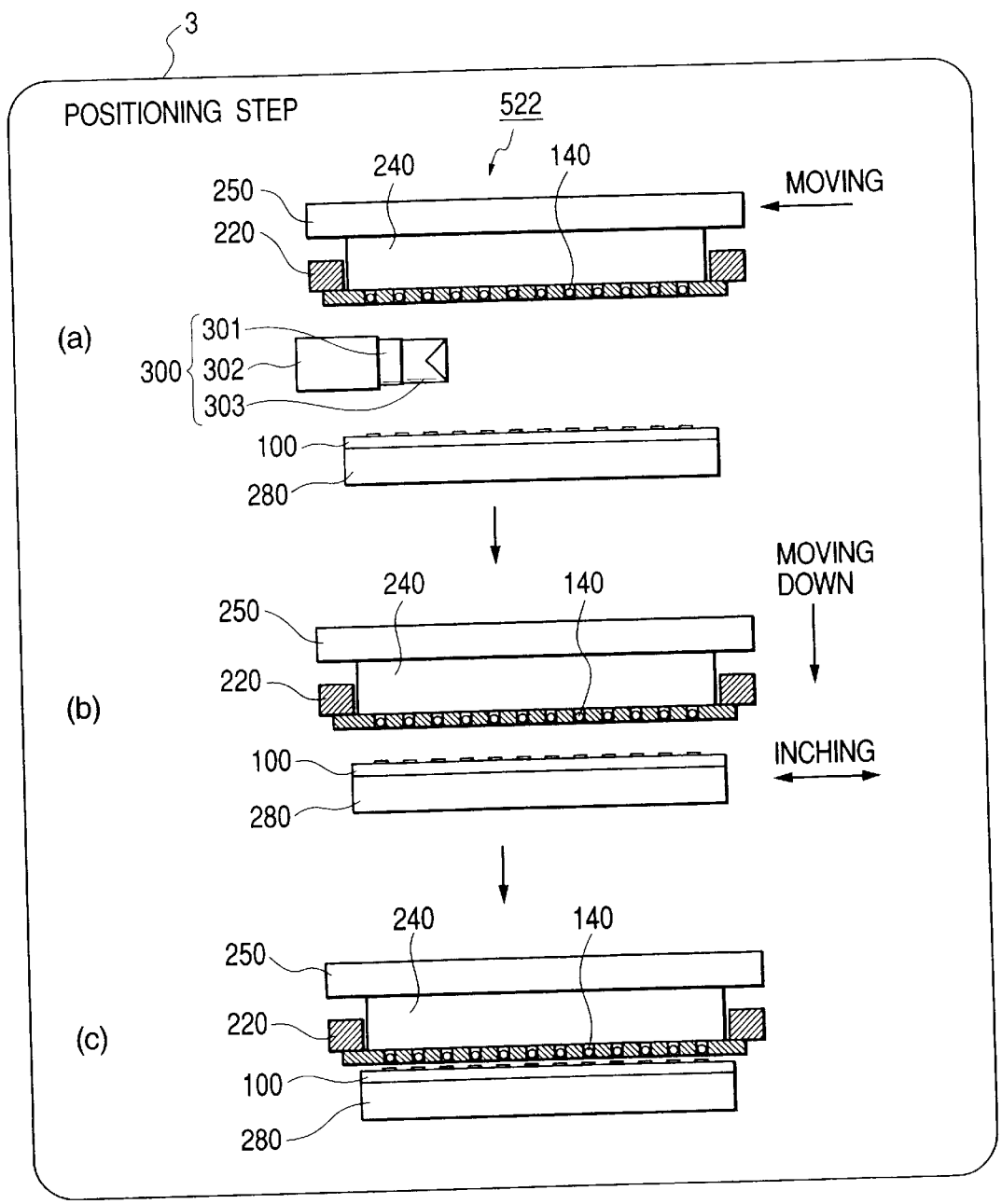
FIG. 9 is an illustration describing a positioning step of a flow of forming bumps in accordance with the present invention.

Next, as shown in FIG. 9(*a*), the group of pads 101 on the object 100 transferred from the adhesive supply station to the transfer station on the transfer rails 505(see FIG. 2) by the transfer unit 528 (see FIG. 2) are relatively aligned with the group of solder balls 140 sucked by the suction head 240 of the suction unit 522 moved from the alignment suction station to the above-mentioned transfer station. That is, the ball mask 220 and the solder balls 140 are sucked by the suction head 240 and are moved above the object 100 at the transfer station by the head moving unit 250. Here, the misalignment between the object 100 and the ball mask 220 is measured by a positioning unit 300. The positioning unit 300 can be constituted, for example, as shown in FIG. 9(*a*), by a CCD camera 302 having a lens 301 and a prism 303 which is mounted on the lens 301 and is capable of taking pictures of objects arranged over and under itself at the same time, and an image processing unit for processing an image signal produced by the CCD camera 302 to measure the amount of the misalignment.

Next, as shown in FIG. 9(b), (c), an high accuracy positioning stage 280 with the object 100 thereon, for example, is inched horizontally based on the amount of misalignment measured to correct the amount of the misalignment between the object and the ball mask 220 and then the head moving unit 250 is vertically lowered to finally arrange the group of solder balls 140 right above the group of pads 101 and then the processing proceeds to the transfer step 7.

Figure 10:
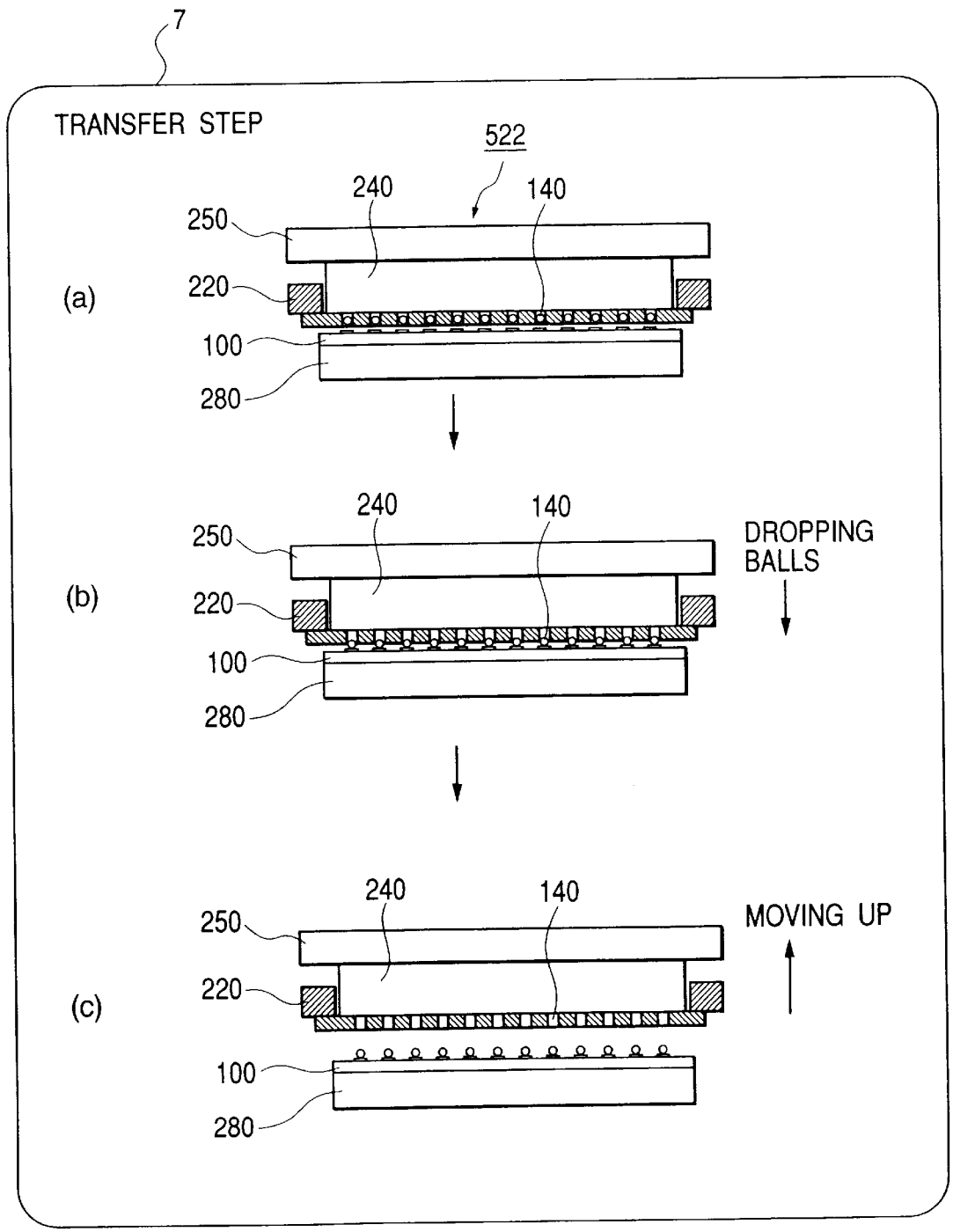
FIG. 10 is an illustration describing a transfer step of a flow of forming bumps in accordance with the present invention.

In the transfer step 7, as shown in FIG. 10, only the group of solder balls 140 are placed on the group of the pads 101 of the object 100. That is, while air is evacuated from the mask air outlet 245, the porous air outlet 244 is made to communicate with the atmosphere, whereby only the solder balls 140 slip from the apertures 221a of the ball mask 220 and drop on the pads 101, as shown in FIG. 10(a) and FIG. 10(b). Since an adhesive 120 is already supplied to the pads 101, the solder balls 140 are stably placed on the pads 101 by the adhesive force of the adhesive 120. Then, as shown in FIG. 10(c), the suction head 240 is moved up and returned to the alignment/suction station where the inclined alignment stage 310 is placed as the air is being evacuated from the mask air outlet 245 and then the mask air outlet 245 is made to communicate with the atmosphere, whereby the ball mask 220 is returned to the initial position.

In this connection, since there are provided two alignment suction stations, as shown in FIG. 2, they perform the positioning step 3 and the transfer step 7 alternately.

Figure 11:
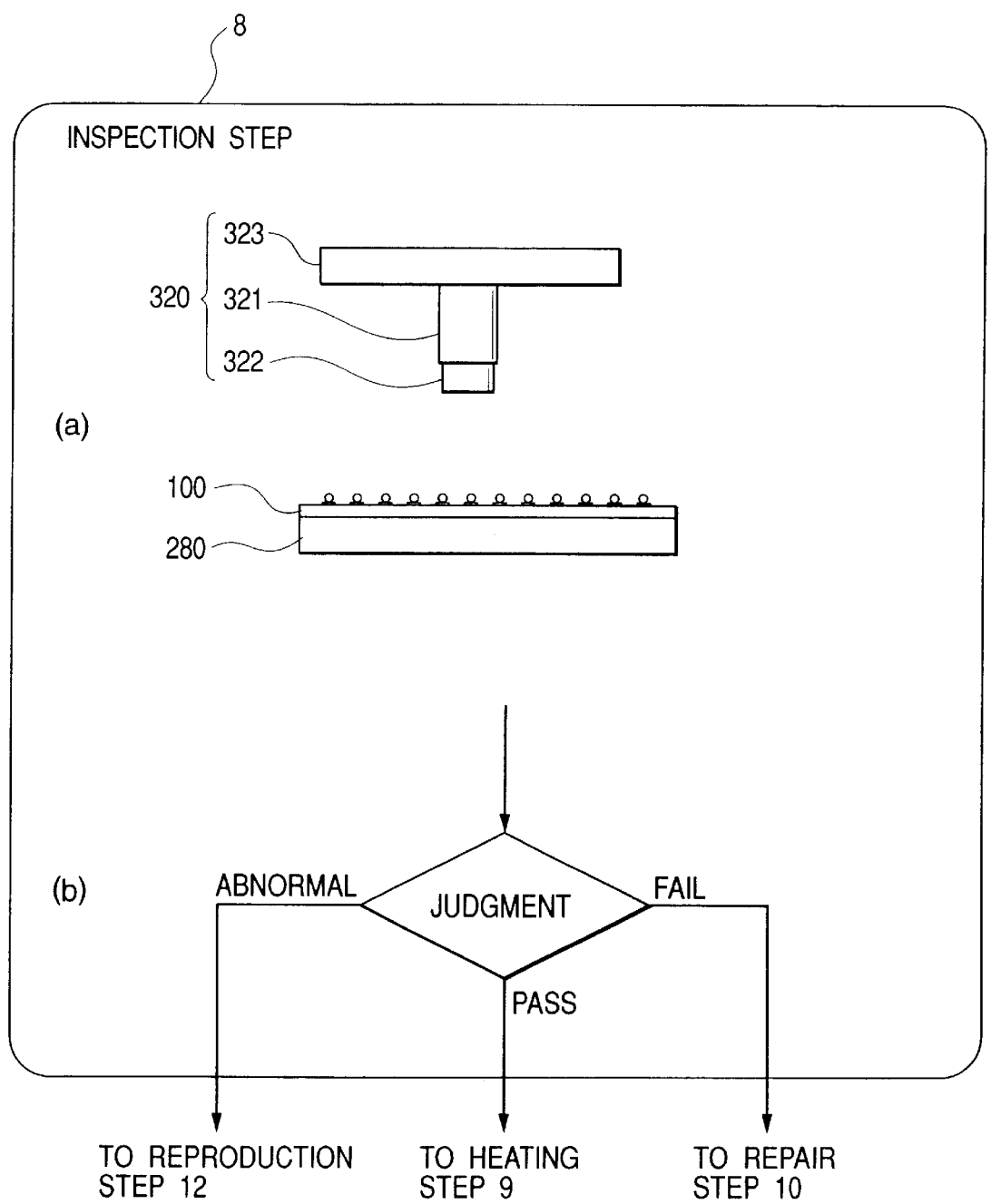
FIG. 11 is an illustration describing an inspection step after the transfer step of a flow of forming bumps in accordance with the present invention.

Next, at the inspection step 8, as shown in FIG. 11(a), the state of mounting of the solder balls 140 is inspected. As shown in FIG. 11(a), a visual inspection unit 320 is moved above the object 100 in the transfer unit 528, and the visual inspection unit 320 of FIG. 11 inspects the presence or absence and the misalignment of the solder balls 140 mounted at the transfer unit 528, and the image processing unit judges whether the solder balls 140 are abnormal or passes the inspection criteria or not, as shown in FIG. 11(b). The inspection method may be the same as is used at the inspection step 5. However, the lighting system of the visual inspection unit 320 may provide a bright field of view so as to make the solder balls 140 clearly visible to the pads.

In the case where the state of mounting of the solder balls 140 is judged to pass the inspection criteria, the object 100 passing the inspection criteria is transferred near to the unloader by the transfer unit 528 and is stored in the cassette in the unloader 502 by the robot mechanism 504. The cassette is then taken out of the unloader 502 and is sent to the heating step 9. In this connection, the object 100 passing the inspection criteria may be transferred directly to a heating furnace without being stored in the unloader 502.

In the case where the state of mounting of the solder balls 140 is judged to fail in the inspection criteria, the object 100 failing in the inspection criteria is transferred to a repair station by the transfer unit 528 and a repair step 10 is performed by a repair mechanism 340.

In this connection, in the case where the state of mounting of the solder balls 140 is extremely bad, the object 100 is regarded as abnormal and is transferred near to the unloader by the transfer unit 502 and is stored in an abnormal cassette in the unloader 502 by the robot mechanism 504 and an alarm processing is performed. Then, the abnormal cassette is taken out of the unloader 502 and is sent to a reproduction step 12. Usually, a maintenance work is performed to the suction unit 522 and the positioning unit 300 in response to an operator call. In this connection, the criteria of judgment in the image processing unit of the visual inspection unit 320 (the maximum permissible number of apertures 221a which are not filled with solder balls, the maximum permissible number of extra solder balls, the maximum permissible number of retrials) are changed according to a required yield, a necessary production cycle time, the number of the solder balls mounted by one operation and the like.

Figure 13:
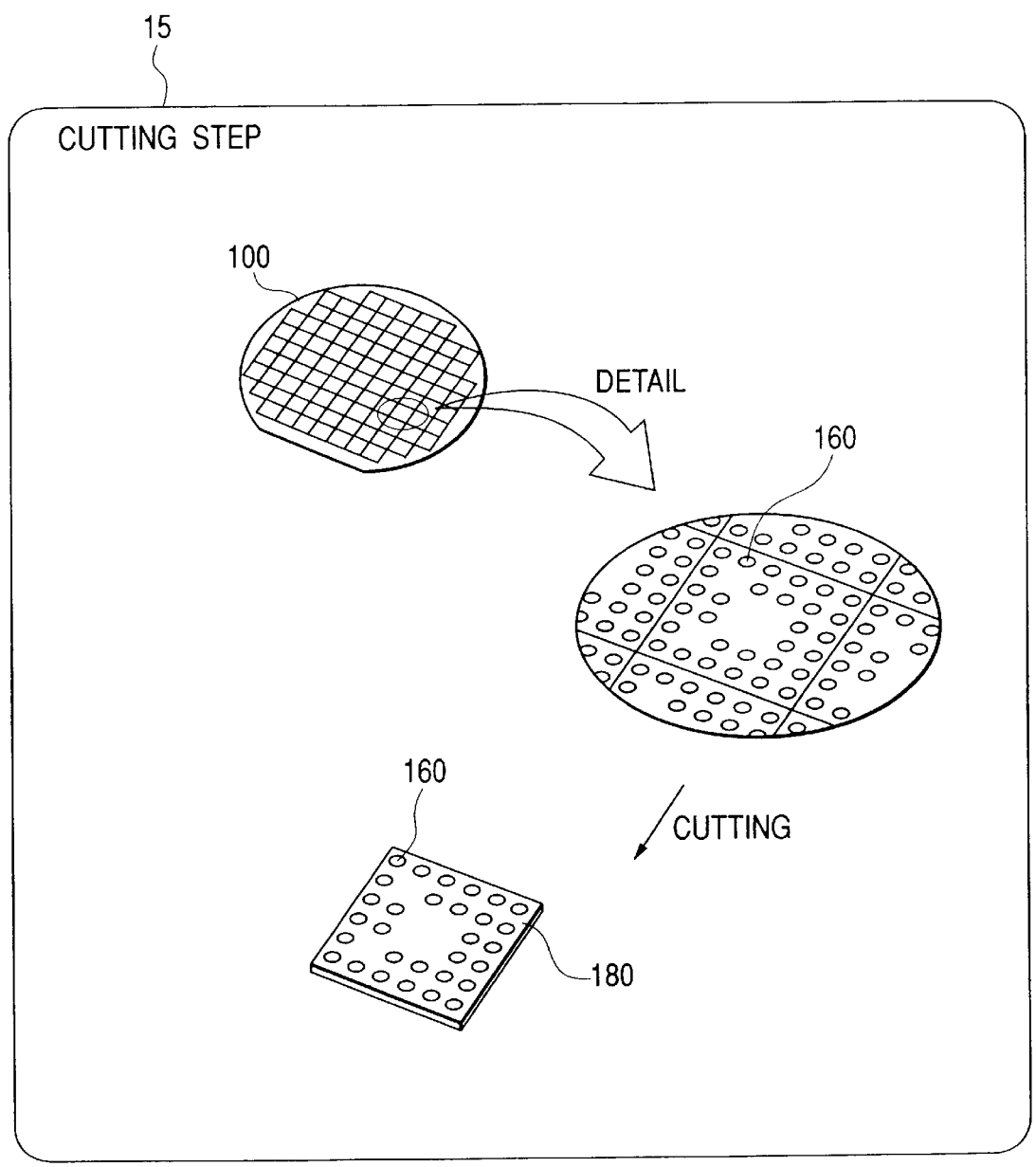
FIG. 13 is an illustration describing a cutting step of a flow of forming bumps in accordance with the present invention.

Next, at the heating step 9, the object 100 passing the inspection criteria and introduced into the step 9 is sent into a nitrogen reflow furnace and the conductive particle-shaped solder balls 140 are melted by heating and are bonded to the pads 101 by the action of the flux of the adhesive 120 to form solder bumps 160 shown in FIG. 13. Then, the object 100 passes the cleaning step 13 for removing the remainder of the flux and undergoes the inspection step 14 in which a bump visual inspection step 14 is performed and then is separated into each chip 180 with a bump at a cutting step 15 shown in FIG. 13, for example, in the case where the object 100 is a wafer.

Figure 12:
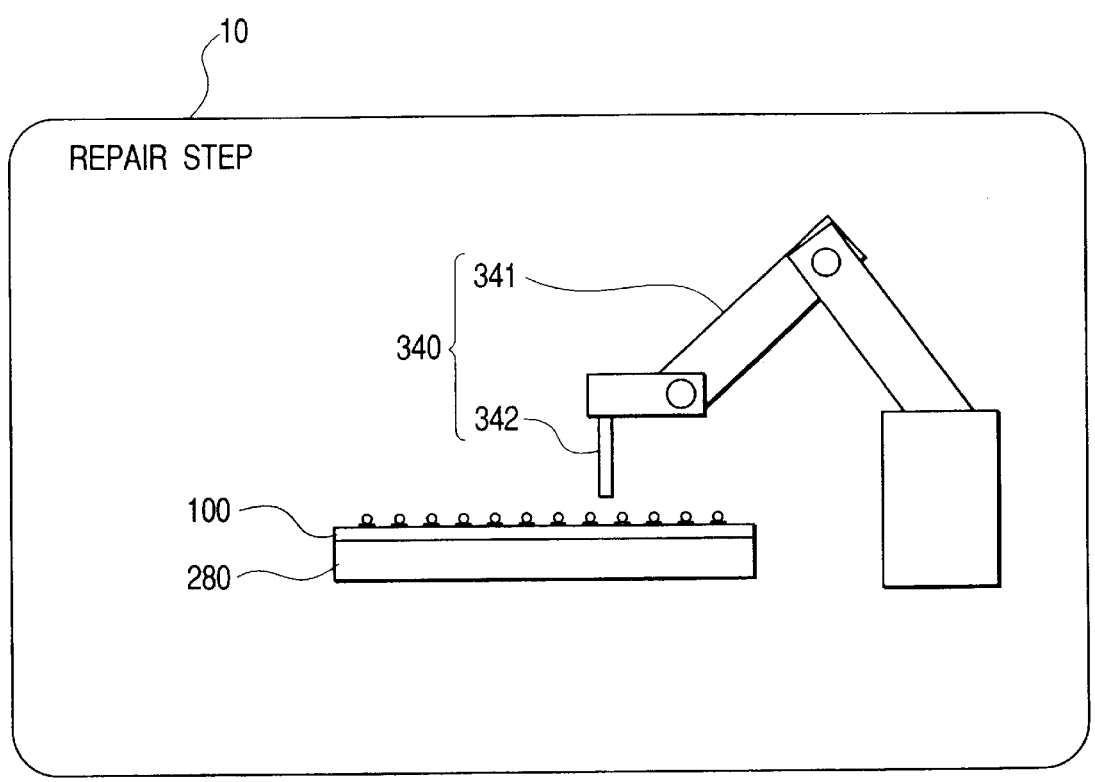
FIG. 12 is an illustration describing a repair step of a flow of forming bumps in accordance with the present invention.

At the above-mentioned repair step 10, as shown in FIG. 2, the state of the mounted solder balls 140 is repaired by the use of the repair mechanism 340 placed on the repair station. The repair mechanism 340 is constituted by an arm 341, vacuum tweezers attached to the arm 341, both of which are shown in FIG. 12, a wiping pad 343 for cleaning the tip ends of the vacuum tweezers, a new ball tray 345, and a defective ball recovery tray 346, which are shown in FIG. 2. In the repair step 10, the extra solder balls 140 or the solder balls 140 shifted in position are removed sequentially with the vacuum tweezers 342 according to the results of inspection at the inspection step 8. The removed solder balls 140 are dropped into the defective ball recovery tray 346. Here, the attached adhesive 120 is always wiped off the tip ends of the vacuum tweezers 342 with the wiping pad 343 to keep the tip ends of the vacuum tweezers 342 clean. Then, new solder balls 140 are replenished from the new ball tray 345 by the vacuum tweezers 342. The replenishing position in this case is above the pad 101 where it is detected that the solder ball is not mounted and above the pad 101 where it is detected that the solder ball is shifted in position and from which the solder ball is removed.

After the repair step 10, an inspection step 11 is performed. An image processing inspection using the visual inspection unit 320 is also performed at this inspection step 11. If the object 100 is found not abnormal in the inspection step 11, the object 100 is passed to the heating step 9. However, in the case where the solder ball is found to be abnormally mounted even after the repair step 10, the object 100 is passed to the reproduction step 12 and an abnormality processing including an operator call is performed.

The reproduction step 12 is basically an abnormality processing and hence it is performed by the intervention of an operator. At the reproduction step 12, the object 100 is cleaned with cleaning water containing an organic solvent or a surface-active agent capable of removing the adhesive 120 such as flux or the like to remove all the solder balls 140. Also, it is checked that the object 100 is not abnormal and that the adhesive supply step 2 and the alignment step 4 are not abnormal.

Figure 14:
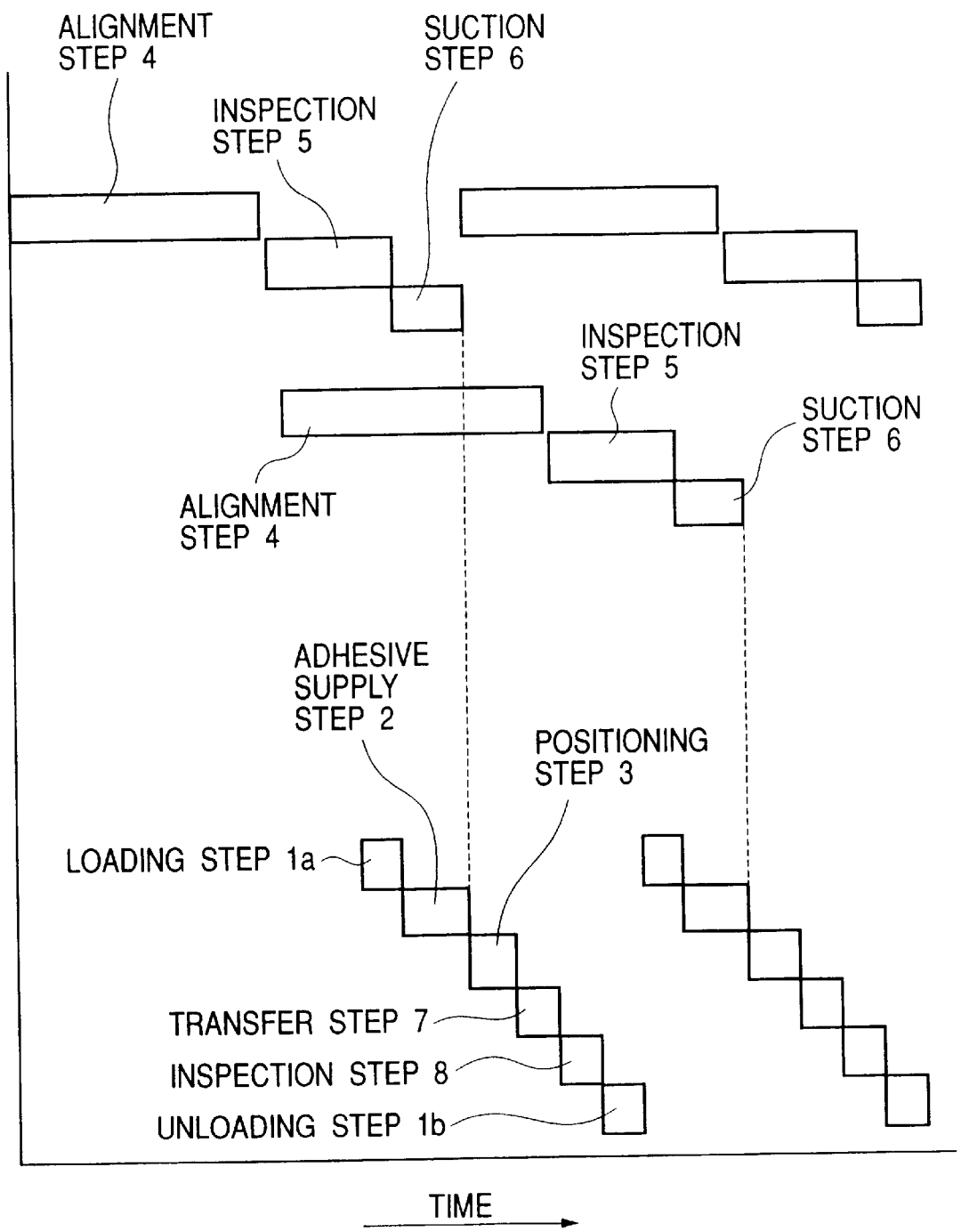
FIG. 14 is an illustration showing a time chart of a system of forming bumps in accordance with the present invention.

Next, the basic sequence of a system for forming bumps in accordance with the present invention will be described with reference to FIG. 14. Since there are two alignment units 522 as shown in FIG. 2, each alignment unit 522 alternately performs a set of the alignment step 4, the inspection step 5, and the suction step 6. On the other hand, since there is provided one transfer unit 528 in the case of a system for forming bumps as shown in FIG. 2, the actions from a loading 1a to an unloading 1b are continuously performed. For this reason, the alignment step 4 can take time and improve the total cycle time.

Figure 15:
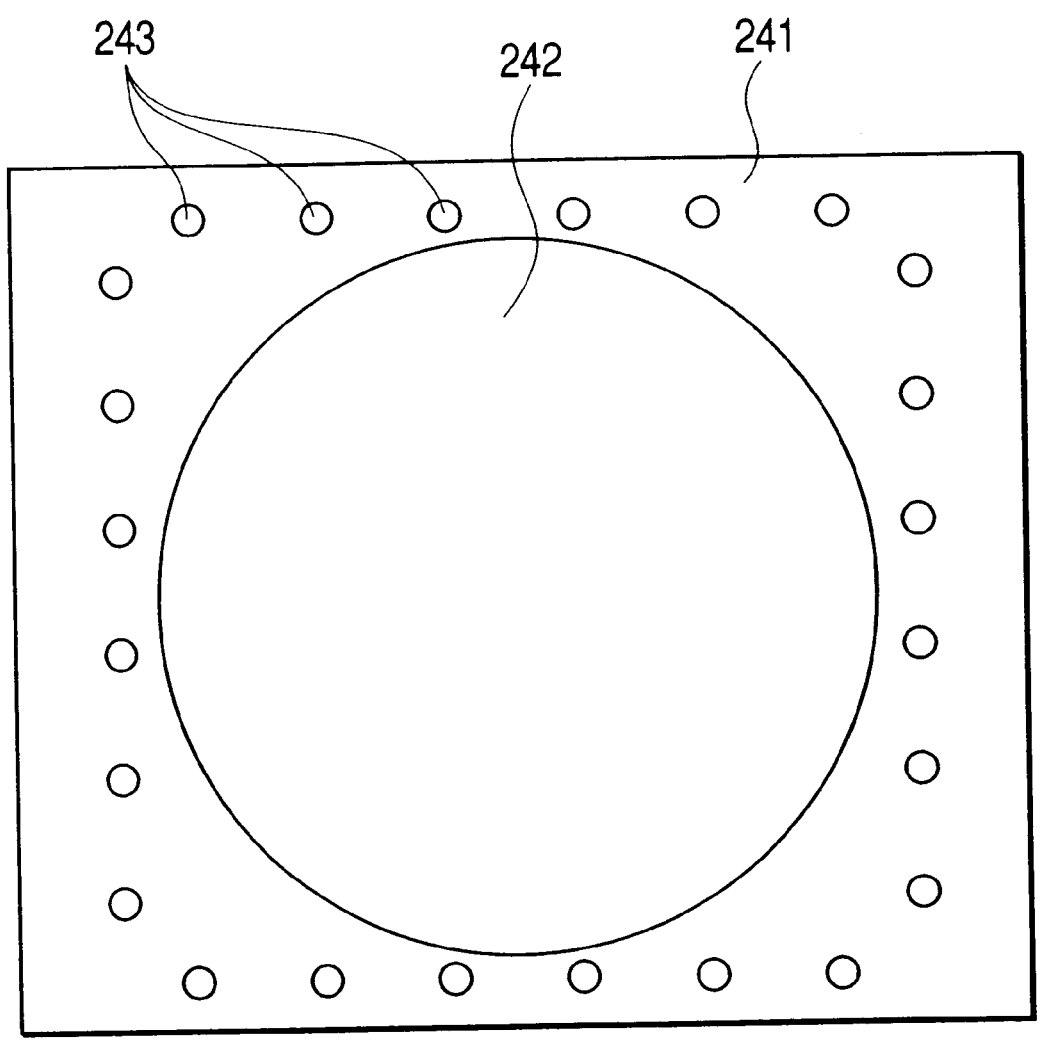
FIG. 15 is a plan view showing on preferred embodiment of a suction head in accordance with the present invention.

Next, the preferred embodiment of the suction head 240 in the suction unit 522 will be described with reference to FIG. 15. FIG. 15 shows the surface of the suction head 240 opposite to a wafer in the case where the object 100 is the wafer. A body 241 has a circular porous plate 242 at the center and many mask suction holes 243 around the porous plate 242. For this reason, the suction head 240 can be shared between the different wafers 100 even if the wafers 100 are different in the arrangement of the pads 101, that is, in the arrangement of the apertures 221a of the stencil 221 of the ball mask 220.

It is usually thought that, to increase the amount of chips, the size of the chip is frequently shrunk and that the arrangement of the pads 101 in a semiconductor device 100 such as a wafer or the like is frequently changed and, according to the preferred embodiment of the present invention, it is possible to respond to such a change in the arrangement of the pads 101 only by changing the flux mask 200 and the ball mask 220. In particular, the stencil 201 and the stencil 221 can be fabricated by making many holes in a thin plate by one operation of etching or the like at lower cost, as compared with a stencil made by drilling, which eliminates a drawback in a conventional ball mounting unit that a vacuum suction head is expensive.

Also, even if the above object 100 of a semiconductor device such as a wafer or the like has tens of thousands of pads, the preferred embodiment in accordance with the present invention can form many bumps on the object 100 by one operation and hence has an advantage of dramatically improving productivity in forming the bumps.

In this connection, a semiconductor device whose bumps can be formed by the present invention includes devices in various states such as a device whose wafer is protected with resin or the like, a device separated from a wafer, a device separated from a wafer and packaged, in addition to a device in a state of a wafer, and, as a matter of course, the present invention does not limit a device on which bumps are formed to a device in a state of a wafer.

Figure 16:
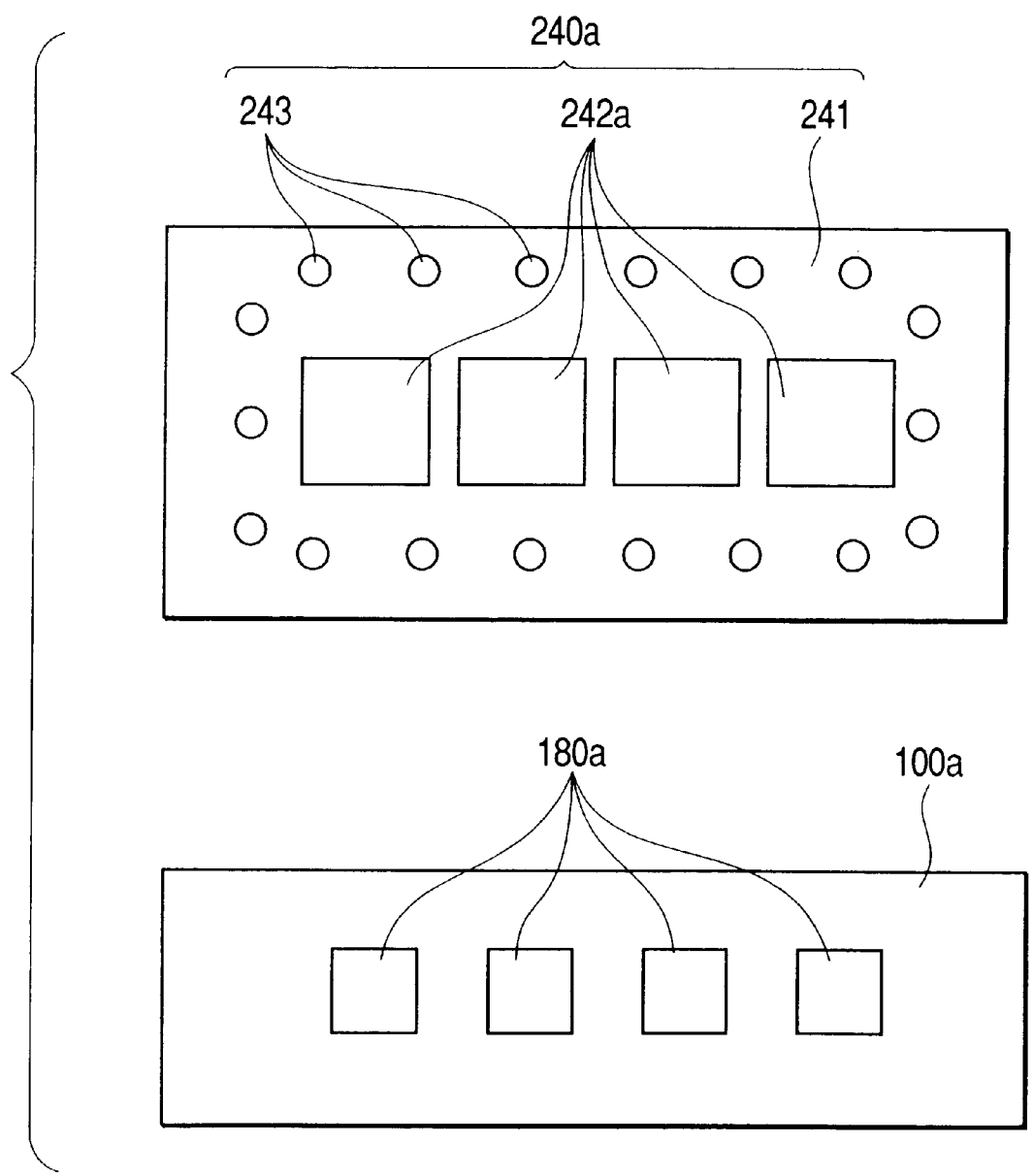
FIG. 16 is a plan view showing a modification of a suction head and an illustration showing a semiconductor device in accordance with the present invention.

For example, as shown in FIG. 16, if a suction head 240a having a plurality of porous plates 242a is used, it is possible to form bumps by one operation on a semiconductor device including a middle substrate 100a and a plurality of chips 180a mounted thereon. Naturally, it is necessary to prepare a ball mask 220 having a stencil 221 in which apertures 221a are formed in accordance with the arrangement of the pads (electrodes) formed on the chips 180a.

In this respect, while an example is shown in FIG. 16 in which four chips are mounted on the substrate by one operation, the number of chips to be mounted can be freely changed. In this case, although this suction head 240a has some limitations to the number of chips and a change in the size of the chip, as compared with the case where the bumps are mounted on the wafer by one operation, it provides a merit that this suction head 240a is used as a substitute for the use of using a conventional solder ball mounting unit designed for a chip.

Figure 17:
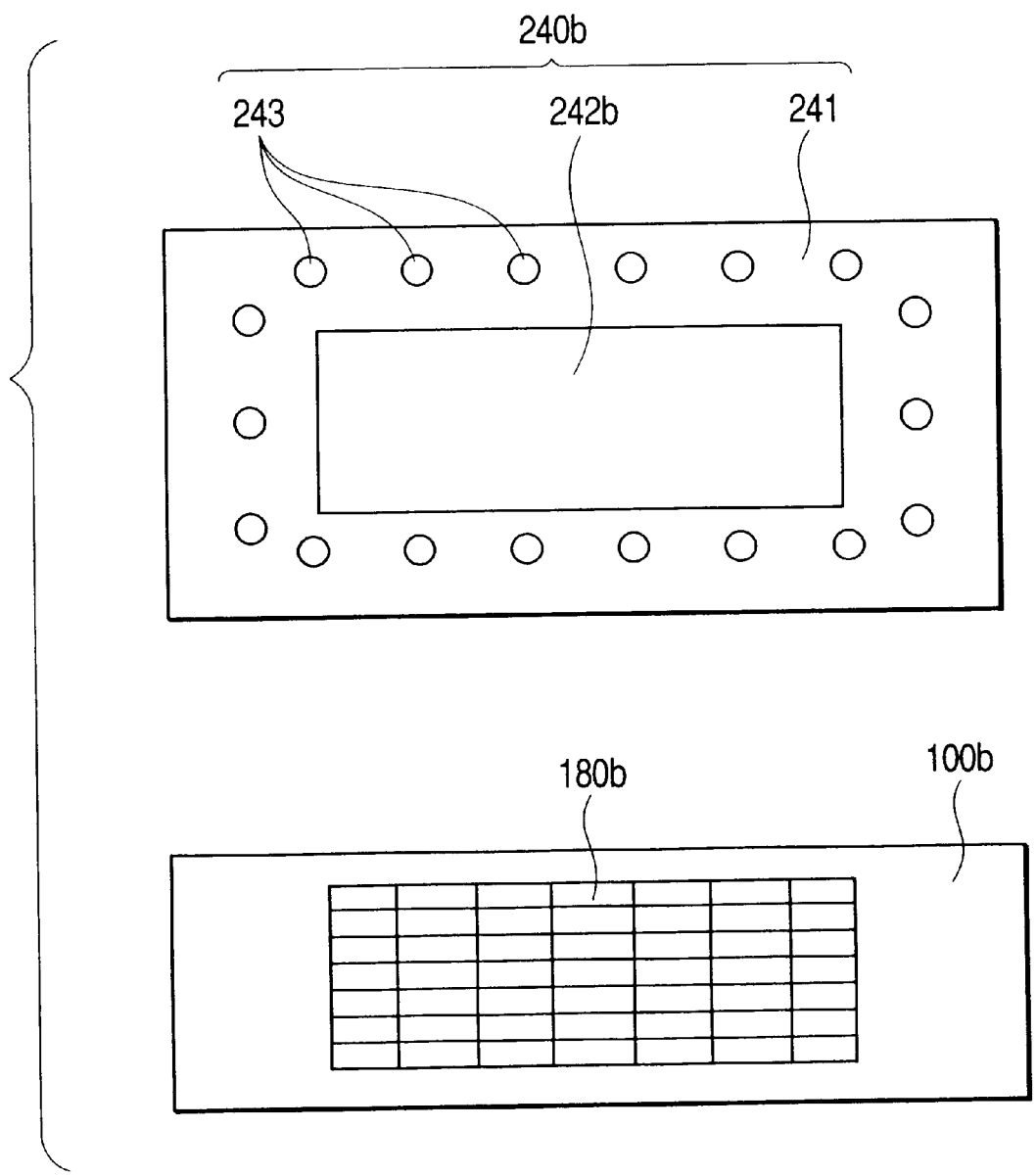
FIG. 17 is a plan view showing another modification of a suction head and an illustration showing a semiconductor device in accordance with the present invention.

Also, as shown in FIG. 17, it is naturally possible to mount bumps on a plurality of chips by one operation by the use of a suction head 240b provided with a single rectangular porous plate 242b. In this case, the suction head 240b can be used for the case where a small chip 180b is cut away from a region and is molded and where solder balls are then mounted thereon.

In the preferred embodiment described above, the suction head 240 is operated by vacuum suction, but it can be also operated by an electromagnetic force. However, in the case where the suction head 240 is operated by the electromagnetic force, it is necessary to put some thought in designing the ball mask (ball alignment jig) 220 and/or the suction head 240. That is, at the suction step 6, it is necessary to attract and hold the ball mask and the group of solder balls (conductive particles) 140 by the attraction head 240 and to lift them from the inclined alignment stage 310 and, at the transfer step 7, it is only required that only the solder balls (conductive particles) 140 can be placed on the pads 101 of the semiconductor device 100 in the state where the ball mask 220 is held by the attraction head 240. Therefore, it is recommended that the stencil 221 of the ball mask 220 be formed of a material not attracted by the electromagnetic force, for example, hard resin, ceramics, or the like and that the frame 202 on which the stencil 221 is placed be formed of a metallic material attracted by the electromagnetic force and be attracted by the attraction head 240. This constitution makes it possible to mount only the solder balls (conductive particles) 140 on the pads 101 of the semiconductor device 100 in a state where the ball mask is held by the attraction head 240 by turning off the application of the electromagnetic attractive force only to the group of solder balls 140.

According to the present invention, there is provided a merit that many bumps having an adequate volume and a narrow range of variations in height and few limitations in selecting material can be easily formed on the pads of an object such as a semiconductor device or the like by one operation at high speeds with high reliability.

Also, according to the present invention, there is provided a merit that because an inexpensive jig can be used and a system can be simply constituted, bumps can be formed in large quantity.

Further, according to the present invention, because conductive particles such as solder balls can be used as the material of bumps, bumps having various compositions can be formed.

Still further, according to the present invention, there is provided an advantage that a suction unit including a ball mask and a suction head using a porous plate can be flexibly respond to a change in designing the positions of bumps.

What is claimed is:

1. A method of forming bumps, the method comprising the steps of:
    an alignment step of placing, on an alignment stage, a plate-like alignment jig having a group of apertures aligned in correspondence with positions where bumps are to be formed, and of charging many conductive particles supplied into the group of apertures of the plate-like alignment jig to align a group of conductive particles with respect to the plate-like alignment jig;
    a suction step of sucking and retaining the group of conductive particles aligned at the alignment step and the plate-like alignment jig for aligning the group of conductive particles by a suction unit to separate them from the alignment stage;
    a positioning step of moving the group of conductive particles and the plate-like alignment jig, both of which are sucked and retained at the suction step, above an object having a group of pads on which bumps are to be formed, and of positioning the plate-like alignment jig relatively to the object;
    a transfer step of relieving the group of conductive particles of suction and retention by the suction unit, in a state where the plate-like alignment jig positioned relatively to the object at the positioning step is placed close to the object, to transfer the group of conductive particles to the group of pads on the object; and a bonding step of bonding the group of conductive particles transferred at the transfer step to the group of pads on the object to form bumps.

2. A method of forming bumps, the method comprising the steps of:

an alignment step of placing, on an alignment stage, a plate-like alignment jig having a group of apertures aligned in correspondence with positions where bumps are formed, and of moving a squeegee storing many conductive particles along the plate-like alignment jig from one end to the other end to sequentially charge the conductive particles into the group of apertures of the plate-like alignment jig to align a group of conductive particles with respect to the plate-like alignment jig;

a suction step of sucking and retaining the group of conductive particles aligned at the alignment step and the plate-like alignment jig for aligning the group of conductive particles by a suction unit to separate them from the alignment stage;

a positioning step of moving the group of conductive particles and the plate-like alignment jig, both of which are sucked and retained at the suction step, above an object having a group of pads on which bumps are to be formed, and of positioning the plate-like jig relatively to the object;

a transfer step of relieving the group of conductive particles of suction and retention by the suction unit in a state where the plate-like alignment jig positioned relatively to the object at the positioning step is placed close to the object to transfer the group of conductive particles to the group of pads on the object; and a bonding step of bonding the group of conductive particles transferred at the transfer step to the group of pads on the object to form bumps.

3. A method of forming bumps, the method comprising the steps of:

an alignment step of placing, on an alignment stage, a plate-like alignment jig having a group of apertures aligned in correspondence with positions where bumps are to be formed, and of moving a squeegee storing many conductive particles and having a sweeping member along the plate-like alignment jig from one end to the other end to sequentially charge the conductive particles into the group of apertures of the plate-like alignment jig, while sweeping away the extra conductive particles by the sweeping member, to align a group of conductive particles with respect to the plate-like alignment jig;

a suction step of sucking and retaining the group of conductive particles aligned at the alignment step and the plate-like alignment jig for aligning the group of conductive particles by a suction unit to separate them from the alignment stage;

a positioning step of moving the group of conductive particles and the plate-like alignment jig, both of which are sucked and retained at the suction step, above an object having a group of pads on which bumps are to be formed, and of positioning the plate-like jig relatively to the object;

a transfer step of relieving the group of conductive particles of suction and retention by the suction unit, in a state where the plate-like alignment jig positioned relatively to the object at the positioning step is placed close to the object, to transfer the group of conductive particles to the group of pads on the object; and a bonding step of bonding the group of conductive particles transferred at the transfer step to the group of pads on the object to form bumps.

4. A method of forming bumps, comprising the steps of:

an alignment step of placing, on an inclined alignment stage, a plate-like alignment jig having a group of apertures aligned in correspondence with positions where bumps are to be formed, and of moving a squeegee storing many conductive particles and having a sweeping member along the inclined plate-like alignment jig from a higher position to a lower position to sequentially charge the stored conductive particles into the group of apertures of the plate-like alignment jig to align a group of conductive particles with respect to the plate-like alignment jig;

a suction step of sucking and retaining the group of conductive particles aligned at the alignment step and the plate-like alignment jig for aligning the group of conductive particles by a suction unit to separate them from the alignment stage;

a positioning step of moving the group of conductive particles and the plate-like alignment jig, both of which are sucked and retained at the suction step, above an object having a group of pads on which bumps are to be formed, and of positioning the plate-like jig relatively to the object;

a transfer step of relieving the group of conductive particles of suction and retention by the suction unit, in a state where the plate-like alignment jig positioned relatively to the object at the positioning step is placed close to the object, to transfer the group of conductive particles to the group of pads on the object; and a bonding step of bonding the group of conductive particles transferred at the transfer step to the group of pads on the object to form bumps.

5. A method of forming bumps, the method comprising the steps of:

an alignment step of placing, on an inclined alignment stage, a plate-like alignment jig having a group of apertures aligned in correspondence with positions where bumps are to be formed, and of moving a squeegee storing many conductive particles and having a sweeping member along the inclined plate-like alignment jig from a higher position to a lower position to sequentially charge the stored conductive particles into the group of apertures of the plate-like alignment jig, while sweeping away extra conductive particles by the sweeping member, to align a group of conductive particles with respect to the plate-like alignment jig;

a suction step of sucking and retaining the group of conductive particles aligned at the alignment step and the plate-like alignment jig for aligning the group of conductive particles by a suction unit to separate them from the alignment stage;

a positioning step of moving the group of conductive particles and the plate-like alignment jig, both of which are sucked and retained at the suction step, above an object having a group of pads on which bumps are to be formed, and of positioning the plate-like jig relatively to the object;

a transfer step of relieving the group of conductive particles of suction and retention by the suction unit, in a state where the plate-like alignment jig positioned relatively to the object at the positioning step is placed close to the object, to transfer the group of conductive particles to the group of pads on the object; and a bonding step of bonding the group of conductive particles transferred at the transfer step to the group of pads on the object to form bumps.

6. A method of forming bumps, the method comprising the steps of:

an alignment step of placing, on an inclined alignment stage, a plate-like alignment jig having a group of apertures aligned in correspondence with positions where bumps are to be formed, and of moving a squeegee storing many conductive particles and having a sweeping member along the inclined plate-like alignment jig from a higher position to a lower position to sequentially charge the stored conductive particles into the group of apertures of the plate-like alignment jig based on the rolling motion of the conductive particles stored in the squeegee, while sweeping away the extra conductive particles by the sweeping member, to align a group of conductive particles with respect to the plate-like alignment jig;

a suction step of sucking and retaining the group of conductive particles aligned at the alignment step and the plate-like alignment jig for aligning the group of conductive particles by a suction unit to separate them from the alignment stage;

a positioning step of moving the group of conductive particles and the plate-like alignment jig, both of which are sucked and retained at the suction step, above an object having a group of pads on which bumps are to be formed, and of positioning the plate-like jig relatively to the object;

a transfer step of relieving the group of conductive particles of suction and retention by the suction unit, in a state where the plate-like alignment jig positioned relatively to the object at the positioning step is placed close to the object, to transfer the group of conductive particles to the group of pads on the object; and a bonding step of bonding the group of conductive particles transferred at the transfer step to the group of pads on the object to form bumps.

7. A method of forming bumps as claimed in any one of claims 1 to 6, further comprising an adhesive supply step of supplying an adhesive at least to the group of pads on the object before the positioning step.

8. A method of forming bumps as claimed in any one of claims 1 to 6, further comprising an inspection step of inspecting, after the alignment step, the state of the group of conductive particles aligned with the group of apertures of the platelike alignment jig at the alignment step.

9. A method of forming bumps as claimed in any one of claims 1 to 6, further comprising an inspection step of inspecting, after the alignment step, the state of the group of conductive particles aligned with the group of apertures of the platelike alignment jig at the alignment step and another alignment step executed in the case where the results of inspection at the inspection step reveal that the number of the apertures of the alignment jig which are not filled with the conductive particles exceeds the maximum permissible number.

10. A method of forming bumps as claimed in any one of claims 1 to 6, further comprising an inspection step of inspecting, after the transfer step, the state of the group of conductive particles transferred to the group of pads on the object at the transfer step.

11. A method of forming bumps as claimed in any one of claims 1 to 6, further comprising an inspection step of inspecting, after the transfer step, the state of the group of conductive particles transferred to the group of pads on the object at the transfer step, and a repair step of selectively mounting the conductive particles on the pads on which the conductive particles are not mounted in the case where the results of inspection at the inspection step reveal that the number of the pads which are not mounted with the conductive particles exceeds the maximum permissible number, and of selectively removing the extra conductive particles in the case where the results of inspection at the inspection step reveal that the number of the extra conductive particles exceeds the maximum permissible number.

12. A method of forming bumps as claimed in any one of claims 1 to 6, further comprising a cutting step of cutting the object having bumps formed on the pads at the bonding step by a desired unit, after the bonding step.

* * * * *